(12) United States Patent
Shan et al.

(10) Patent No.: US 12,223,908 B2
(45) Date of Patent: Feb. 11, 2025

(54) DISPLAY SUBSTRATE, DISPLAY PANEL AND DISPLAY DEVICE

(71) Applicant: BOE Technology Group Co., Ltd., Beijing (CN)

(72) Inventors: Zhenzhen Shan, Beijing (CN); Libin Liu, Beijing (CN); Jiangnan Lu, Beijing (CN); Shiming Shi, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/262,598

(22) PCT Filed: Aug. 24, 2022

(86) PCT No.: PCT/CN2022/114510
§ 371 (c)(1),
(2) Date: Jul. 24, 2023

(87) PCT Pub. No.: WO2023/051109
PCT Pub. Date: Apr. 6, 2023

(65) Prior Publication Data
US 2024/0112636 A1    Apr. 4, 2024

(51) Int. Cl.
*G09G 3/3258* (2016.01)
*G09G 3/32* (2016.01)
(Continued)

(52) U.S. Cl.
CPC ............. *G09G 3/3258* (2013.01); *G09G 3/32* (2013.01); *G09G 3/3233* (2013.01);
(Continued)

(58) Field of Classification Search
CPC ......... G09G 2300/0426; G09G 3/3233; G09G 3/32; G09G 2320/0233; G09G 2300/0819;
(Continued)

(56) References Cited

U.S. PATENT DOCUMENTS 11,257,435 B2    2/2022   Kim et al.
11,373,601 B2 *  6/2022   Wang ................... G11C 19/28
(Continued)

FOREIGN PATENT DOCUMENTS

CN    107146577 A    9/2017
CN    111724745 A    9/2020
(Continued)

*Primary Examiner* — Dismery Mercedes
(74) *Attorney, Agent, or Firm* — Westman, Champlin & Koehler, P.A.

(57) ABSTRACT

A display substrate includes a pixel driving circuit, which includes a driving circuit, a storage circuit and a reset circuit. The reset circuit is electrically connected to a first terminal of the driving circuit. The driving circuit is used to conduct a path between the first terminal and a second terminal of the driving circuit under the control of a potential at its control terminal. The storage circuit is electrically connected to the control terminal of the driving circuit. The reset circuit includes a first capacitor. The storage circuit includes a second capacitor. An area of an overlap between orthographic projections of a first electrode plate and a second electrode plate of the first capacitor on the base substrate is smaller than that of the second capacitor on the base substrate.

20 Claims, 21 Drawing Sheets

(51) Int. Cl.
  *G09G 3/3233* (2016.01)
  *G09G 3/3266* (2016.01)
  *G11C 19/28* (2006.01)
  *H01L 27/12* (2006.01)
  *H01L 21/77* (2017.01)

(52) U.S. Cl.
  CPC ........... *G09G 3/3266* (2013.01); *G11C 19/28* (2013.01); *H01L 27/124* (2013.01); *G09G 2300/0426* (2013.01); *G09G 2300/0852* (2013.01); *G09G 2310/061* (2013.01); *G09G 2310/08* (2013.01); *G09G 2320/0247* (2013.01); *G09G 2330/021* (2013.01); *H01L 21/77* (2013.01); *H01L 27/12* (2013.01)

(58) Field of Classification Search
  CPC ........... G09G 3/3258; G09G 2310/061; G09G 2300/0852; G09G 2330/021; G09G 3/3266; G09G 2300/0842; H10K 59/131; H10K 59/1213; H10K 59/805; H10K 59/82; H10K 59/1216; H10K 59/121; H10K 59/1201; H01L 27/124; H01L 27/1255; H01L 27/12; H01L 21/77; G11C 19/28
  See application file for complete search history.

(56) References Cited

U.S. PATENT DOCUMENTS

| | | |
|---|---|---|
| 11,450,271 B2 | 9/2022 | Na |
| 11,488,530 B2 | 11/2022 | Wang et al. |
| 11,735,108 B2 * | 8/2023 | Liu ...................... H10K 59/351 345/214 |
| 11,790,847 B2 * | 10/2023 | Du ........................ H10K 59/131 345/690 |
| 11,915,645 B2 * | 2/2024 | Wang .................. H01L 27/1255 |
| 11,967,286 B2 * | 4/2024 | Yu .......................... G11C 19/28 |
| 2021/0020104 A1 | 1/2021 | Lu et al. |
| 2021/0043143 A1 | 2/2021 | Kim et al. |
| 2021/0125557 A1 | 4/2021 | Na |
| 2022/0077244 A1 * | 3/2022 | Wang ..................... G09G 3/3266 |
| 2022/0114958 A1 * | 4/2022 | Feng ..................... G09G 3/3258 |
| 2022/0157238 A1 | 5/2022 | Wang et al. |
| 2022/0310772 A1 * | 9/2022 | Qing ..................... G09G 3/3225 |
| 2022/0376024 A1 | 11/2022 | Zheng et al. |
| 2022/0383811 A1 | 12/2022 | Liu et al. |
| 2023/0052846 A1 | 2/2023 | Zheng et al. |
| 2023/0237963 A1 | 7/2023 | Liu et al. |
| 2023/0360600 A1 | 11/2023 | Wang et al. |

FOREIGN PATENT DOCUMENTS

| | | |
|---|---|---|
| CN | 111933080 A | 11/2020 |
| CN | 112053661 A | 12/2020 |
| CN | 112349246 A | 2/2021 |
| CN | 112712774 A | 4/2021 |
| CN | 112992071 A | 6/2021 |
| CN | 113140179 A | 7/2021 |
| CN | 113257885 A | 8/2021 |
| CN | 217134377 U | 8/2022 |
| JP | 2005122076 A | 5/2005 |
| WO | 2021016946 A1 | 2/2021 |

* cited by examiner

6

DISPLAY SUBSTRATE, DISPLAY PANEL AND DISPLAY DEVICE

CROSS-REFERENCE TO RELATED APPLICATION(S)

This application is a Section 371 National Stage Application of International Application No. PCT/CN2022/114510, filed on Aug. 24, 2022, which published as WIPO Publication No. 2023/051109 A1, on Apr. 6, 2023, not in English, which claims priority to Chinese Patent Application No. 202111168519.7, filed on Sep. 30, 2021, the disclosures of which are incorporated herein by reference in their entireties.

TECHNICAL FIELD

The present disclosure relates to a field of display technology, and specifically relates to a display substrate, a display panel and a display device.

BACKGROUND

Organic light-emitting diode (abbreviated as OLED) display device is a type of display device that uses luminous OLEDs to display information such as an image. The OLED display device has characteristics such as low power consumption, high brightness, and high response speed. Low temperature poly-oxide TFT (hereinafter referred to as LTPO TFT) technology is an emerging thin film transistor technology in recent years. In theory, compared to traditional low temperature poly-silicon TFT (hereinafter referred to as LTPS TFT) technology, LTPO TFT may save 5-15% of power, so that the power consumption of an entire display screen is lower.

The above information disclosed in this section is only for understanding the background of the technical concept of the present disclosure. Therefore, the above information may include information that does not constitute the existing technologies.

SUMMARY

In an aspect, a display substrate is provided, including: a base substrate;
a first semiconductor layer disposed on the base substrate;
a first conductive layer disposed on a side of the first semiconductor layer away from the base substrate; and
a second conductive layer disposed on a side of the first conductive layer away from the base substrate,
where the display substrate further includes a pixel driving circuit disposed on the base substrate, the pixel driving circuit includes a driving circuit, a storage circuit and a reset circuit, where the reset circuit is electrically connected to a first terminal of the driving circuit or a second terminal of the driving circuit, and is configured to initialize a potential at the first terminal of the driving circuit or a potential at the second terminal of the driving circuit in an initialization stage; the driving circuit is configured to conduct a path between the first terminal of the driving circuit and the second terminal of the driving circuit under control of a potential at a control terminal of the driving circuit; and the storage circuit is electrically connected to the control terminal of the driving circuit and is configured to store electrical energy; and where the reset circuit includes a first capacitor, the storage circuit includes a second capacitor, the first capacitor includes a first electrode plate and a second electrode plate disposed opposite to the first electrode plate, the second capacitor includes a first electrode plate and a second electrode plate disposed opposite to the first electrode plate, and the first electrode plate of the first capacitor and the first electrode plate of the second capacitor are located in the first conductive layer, and the second electrode plate of the first capacitor and the second electrode plate of the second capacitor are located in the second conductive layer; an orthographic projection of the first electrode plate of the first capacitor on the base substrate and an orthographic projection of the first electrode plate of the second capacitor are spaced from each other on the base substrate, an orthographic projection of the second electrode plate of the first capacitor on the base substrate and an orthographic projection of the second electrode plate of the second capacitor are spaced from each other on the base substrate, the orthographic projection of the first electrode plate of the first capacitor on the base substrate at least partially overlaps with the orthographic projection of the second electrode plate of the first capacitor on the base substrate, and the orthographic projection of the first electrode plate of the second capacitor on the base substrate at least partially overlaps with the orthographic projection of the second electrode plate of the second capacitor on the base substrate, where an area of the overlap between the orthographic projection of the first electrode plate of the first capacitor on the base substrate and the orthographic projection of the second electrode plate of the first capacitor on the base substrate is smaller than an area of the overlap between the orthographic projection of the first electrode plate of the second capacitor on the base substrate and the orthographic projection of the second electrode plate of the second capacitor on the base substrate, and a ratio of the area of the overlap between the orthographic projection of the first electrode plate of the second capacitor on the base substrate and the orthographic projection of the second electrode plate of the second capacitor on the base substrate to the area of the overlap between the orthographic projection of the first electrode plate of the first capacitor on the base substrate and the orthographic projection of the second electrode plate of the first capacitor on the base substrate is within a range of 5 to 20.

According to some exemplary embodiments, the display substrate further includes a first light-emitting control line disposed on the base substrate, and the first light-emitting control line is configured to supply a first light-emitting control signal to the pixel driving circuit, where the first light-emitting control line is located in the first conductive layer, and a part of the first light-emitting control line overlapping with the second electrode plate of the first capacitor forms the first electrode plate of the first capacitor.

According to some exemplary embodiments, the pixel driving circuit includes a first light-emitting control circuit and a second light-emitting control circuit. The first light-emitting control circuit includes a fifth transistor, the second light-emitting control circuit includes a sixth transistor, the fifth transistor includes a fifth gate, and the sixth transistor includes a sixth gate. The first light-emitting control line applies the first light-emitting control signal to the fifth gate, the sixth gate and the first electrode plate of the first capacitor.

According to some exemplary embodiments, a part of the first light-emitting control line overlapping with the first semiconductor layer forms the fifth gate, and another part of the first light-emitting control line overlapping with the first semiconductor layer forms the sixth gate. The first light-emitting control line further includes a widened portion, the widened portion is located between the fifth gate and the sixth gate in a first direction, and a size of the widened portion in a second direction is greater than a size of each of the fifth gate and the sixth gate in the second direction. The first light-emitting control line extends in the first direction, and the second direction intersects with the first direction. At least a part of the widened portion forms the first electrode plate of the first capacitor.

According to some exemplary embodiments, the orthographic projection of the second electrode plate of the first capacitor on the base substrate covers an orthographic projection of the widened portion on the base substrate; and/or
- an area of the orthographic projection of the first electrode plate of the second capacitor on the base substrate is greater than an area of the orthographic projection of the widened portion on the base substrate; and/or,
- an area of the orthographic projection of the second electrode plate of the second capacitor on the base substrate is greater than an area of the orthographic projection of the second electrode plate of the first capacitor on the base substrate.

According to some exemplary embodiments, the ratio of the area of the overlap between the orthographic projection of the first electrode plate of the second capacitor on the base substrate and the orthographic projection of the second electrode plate of the second capacitor on the base substrate to the area of the overlap between the orthographic projection of the first electrode plate of the first capacitor on the base substrate and the orthographic projection of the second electrode plate of the first capacitor on the base substrate is within a range of 8 to 10.

According to some exemplary embodiments, the second electrode plate of the second capacitor includes a through hole exposing at least a part of the first electrode plate of the second capacitor, and a ratio of an area of the orthographic projection of the second electrode plate of the first capacitor on the base substrate to an area of an orthographic projection of the through hole on the base substrate is within a range of 1.1 to 5.

According to some exemplary embodiments, the display substrate further includes a light-emitting element reset line located in the first conductive layer and a light-emitting element disposed on the base substrate. The pixel driving circuit includes a second initialization circuit configured to initialize a first electrode of the light-emitting element under control of a signal provided by the light-emitting element reset line.

According to some exemplary embodiments, the display substrate further includes a reset control line located in the first conductive layer, where the pixel driving circuit includes a first initialization circuit configured to initialize the driving circuit under control of a reset control signal provided by the reset control line; and a frequency of the signal provided by the light-emitting element reset line is higher than a frequency of the reset control signal provided by the reset control line.

According to some exemplary embodiments, the display substrate further includes a light-emitting element reset line located in the first conductive layer and a light-emitting element disposed on the base substrate. The pixel driving circuit includes a second initialization circuit, where the second initialization circuit includes a seventh transistor, and a part of the light-emitting element reset line overlapping with the first semiconductor layer forms a seventh gate of the seventh transistor. The orthographic projection of the first electrode plate of the first capacitor on the base substrate is between the orthographic projection of the first electrode plate of the second capacitor on the base substrate and an orthographic projection of the light-emitting element reset line on the base substrate in a second direction.

According to some exemplary embodiments, the pixel driving circuit includes a first transistor, and a part of a reset control line overlapping with the first semiconductor layer forms a first gate of the first transistor. A spacing between the first gate and the first electrode plate of the first capacitor in a first direction is smaller than a spacing between the seventh gate and the first electrode plate of the first capacitor in the first direction.

According to some exemplary embodiments, the display substrate further includes a second light-emitting control line located in the second conductive layer, where an orthographic projection of the second light-emitting control line on the base substrate, the orthographic projection of the second electrode plate of the second capacitor on the base substrate and the orthographic projection of the second electrode plate of the first capacitor on the base substrate are disposed at intervals along a second direction; and the orthographic projection of the second electrode plate of the first capacitor on the base substrate and the orthographic projection of the second light-emitting control line on the base substrate are respectively located on both sides of the orthographic projection of the second electrode plate of the second capacitor on the base substrate in the second direction.

According to some exemplary embodiments, the display substrate further includes: a second semiconductor layer disposed on a side of the second conductive layer away from the base substrate, and a third conductive layer disposed on a side of the second semiconductor layer away from the base substrate. The second semiconductor layer includes an oxide semiconductor material. The display substrate includes a further second light-emitting control line located in the third conductive layer, where the second light-emitting control line is electrically connected to the further second light-emitting control line. The pixel driving circuit includes an on-off control circuit, where the on-off control circuit includes an eighth transistor, a part of the second light-emitting control line overlapping with the second semiconductor layer forms a bottom gate of the eighth transistor, and a part of the further second light-emitting control line overlapping with the second semiconductor layer forms a top gate of the eighth transistor.

According to some exemplary embodiments, the display substrate further includes a fourth conductive layer disposed on a side of the third conductive layer away from the base substrate, where the driving circuit includes a third transistor. The display substrate includes a fifth conductive portion located in the fourth conductive layer, where one end of the fifth conductive portion is electrically connected to the second electrode plate of the first capacitor through a first via hole, and another end of the fifth conductive portion is electrically connected to a first electrode of the third transistor through a second via hole.

According to some exemplary embodiments, the display substrate includes a sixth conductive portion located in the fourth conductive layer, where the sixth conductive portion includes a first part, a second part and a third part. The first part of the sixth conductive portion is electrically connected to a first electrode of the fifth transistor through a third via hole, and the second part of the sixth conductive portion is electrically connected to the second electrode plate of the second capacitor through a fourth via hole.

According to some exemplary embodiments, the display substrate further includes a fifth conductive layer disposed on a side of the fourth conductive layer away from the base substrate, where the display substrate further includes a first voltage line disposed in the fifth conductive layer, and the third part of the sixth conductive portion is electrically connected to the first voltage line through a fifth via hole.

According to some exemplary embodiments, the display substrate includes a seventh conductive portion located in the fourth conductive layer, where the seventh conductive portion is electrically connected to a first electrode of the sixth transistor, and the orthographic projection of the first electrode plate of the first capacitor on the base substrate is between an orthographic projection of the sixth conductive portion on the base substrate and an orthographic projection of the seventh conductive portion on the base substrate in a first direction, and any two of the orthographic projection of the first electrode plate of the first capacitor on the base substrate, the orthographic projection of the sixth conductive portion on the base substrate and the orthographic projection of the seventh conductive portion on the base substrate are spaced apart from each other.

According to some exemplary embodiments, the orthographic projection of the second electrode plate of the first capacitor on the base substrate partially overlaps with the orthographic projection of the seventh conductive portion on the base substrate.

According to some exemplary embodiments, the display substrate includes a fourth conductive portion located in the fourth conductive layer, one end of the fourth conductive portion is electrically connected to a first electrode of the eighth transistor through a sixth via hole, and another end of the fourth conductive portion is electrically connected to a third gate of a third transistor through a seventh via hole and a through hole.

According to some exemplary embodiments, an orthographic projection of a first voltage line on the base substrate covers an orthographic projection of the fourth conductive portion on the base substrate; and/or, the orthographic projection of the first voltage line on the base substrate covers an orthographic projection of an active layer of the eighth transistor on the base substrate.

In another aspect, a display panel is provided, including the display substrate as described above.

In yet another aspect, a display device is provided, including the display substrate as described above or the display panel as described above.

BRIEF DESCRIPTION OF THE DRAWINGS

By describing exemplary embodiments of the present disclosure in detail with reference to accompanying drawings, the features and advantages of the present disclosure will become more apparent.

DETAILED DESCRIPTION OF EMBODIMENTS

Figure 1:
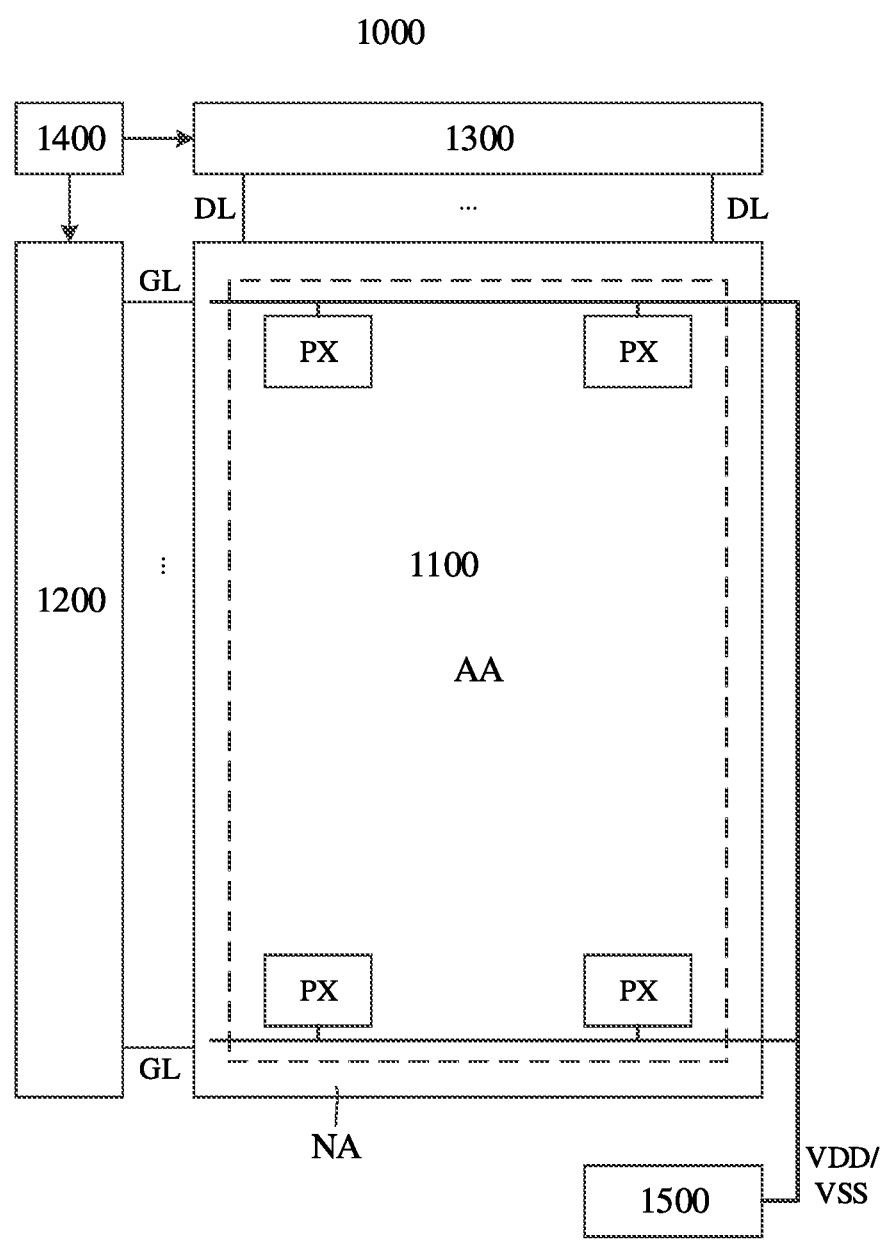
FIG. 1 is a schematic plan view of a display device according to some embodiments of the present disclosure.

In order to make the objectives, technical solutions and advantages of the embodiments of the present disclosure more clear, the technical solutions of the embodiments of the present disclosure will be clearly and completely described below with reference to the accompanying drawings. Obviously, the described embodiments are some, but not all, embodiments of the present disclosure. Based on the described embodiments of the present disclosure, all of the other embodiments obtained by those of ordinary skill in the art without creative efforts fall within the protection scope of the present disclosure.

It will be noted that, in the drawings, a size and a relative size of the elements may be exaggerated for clarity and/or description. In this way, a dimension and a relative dimension of the various elements are not necessarily limited to those shown in the drawings. In the specification and drawings, a same or similar reference number refer to a same or similar part.

When an element is described as being "on", "connected to", or "coupled to" another element, the element may be directly on, directly connected to, or directly coupled to the other element, or intermediate elements may be existed. However, when an element is described as being "directly on", "directly connected to", or "directly coupled to" another element, there is no intermediate element existed. Other terms and/or expressions used to describe a relationship between elements should be interpreted in a similar fashion, e.g., "between" versus "directly between", "adjacent" versus "directly adjacent", or "on" versus "directly on" etc. Furthermore, the term "connected" may refer to a physical connection, an electrical connection, a communication connection, and/or a fluid connection. In addition, an X axis, a Y axis and a Z axis are not limited to a three axes of a rectangular coordinate system, and may be interpreted in a broader sense. For example, the X, Y, and Z axes may be perpendicular to each other, or may represent different directions that are not perpendicular to each other. For a purpose of the present disclosure, "at least one of X, Y, and Z" and "at least one of the selected groups consisted of X, Y, and Z" may be interpreted as X only, Y only, Z only, or such as any combination of two or more of X, Y and Z in XYZ, XYY, YZ and ZZ. As used herein, the term "and/or" includes any and all combinations of one or more of the associated listed items.

It will be noted that, although the terms "first", "second", etc. may be used herein to describe various components, members, elements, regions, layers and/or parts, these components, members, elements, regions, layers and/or parts shall not be limited by these terms. Rather, these terms are used to distinguish one component, member, element, region, layer and/or part from another. Thus, for example, a first component, a first member, a first element, a first region, a first layer and/or a first part discussed below could be referred to as a second component, a second member, a second element, a second region, a second layer and/or a second part without departing from the teachings of the present disclosure.

For ease of description, a spatially relational term, e.g., "upper", "lower", "left", "right", etc. may be used herein to describe a relationship between one element or feature with another element or feature as shown in the drawings. It should be understood that the spatially relational term are intended to encompass other different orientations of the apparatus in use or operation in addition to an orientation depicted in the drawings. For example, if the apparatus in the drawings is turned over, the elements described as "below" or "beneath" the other elements or features would then be oriented "above" or "on" the other elements or features.

In the present disclosure, the terms "basically", "about", "approximately", "roughly" and other similar terms are used as approximate terms rather than as terms of degree, and they are intended to explain the fixed deviation of measured or calculated values that will be recognized by those skilled in the art. Taking into account factors such as process fluctuations, measurement problems and errors related to the measurement of a specific amount (i.e., the limitations of the measurement system), the "about" or "approximately" used here includes the stated value, and indicates that the specific value determined by ordinary technicians in the art is within the acceptable deviation range. For example, "about" may be expressed within one or more standard deviations, or within ±30%, ±20%, ±10%, ±5% of the stated values.

It will be noted that the expression "same layer" refers to a layer structure which is formed by forming a layer used to form a specific pattern by the same film-forming process, and then patterning the layer by using the same mask through one patterning process. According to the difference between the specific patterns, the patterning process may include multiple exposure, development or etching processes, and the specific pattern in the formed layer structure may be continuous or discontinuous. That is, multiple elements, components, structures and/or parts located in the "same layer" are made of the same material and formed by the same patterning process. Generally, multiple elements, components, structures and/or parts located in the "same layer" have substantially the same thicknesses.

Those skilled in the art will understand that herein, unless otherwise specified, the expression "height" or "thickness" refers to a dimension of a surface of each film layer along a direction perpendicular to the display substrate, i.e., a dimension along a light exit direction of the display substrate, or referred to as a dimension along a normal direction of the display device.

In this text, the expression "transistor" may refer to a transistor, a thin film transistor, or a field-effect transistor, or other devices with the same characteristics. In embodiments of the present disclosure, in order to distinguish between the two electrodes of the transistor except for a control electrode, one electrode is referred to as a first electrode and the other electrode is referred to as a second electrode. In practical operation, when the transistor is a thin film transistor or a field-effect transistor, the first electrode may be a drain, and the second electrode may be a source. Alternatively, the first electrode may be a source, and the second electrode may be a drain.

Embodiments of the present disclosure provides at least a display substrate. The display substrate includes: a base substrate; a first semiconductor layer disposed on the base substrate; a first conductive layer disposed on a side of the first semiconductor layer away from the base substrate; and a second conductive layer disposed on a side of the first conductive layer away from the base substrate. The display substrate further includes a pixel driving circuit disposed on the base substrate. The pixel driving circuit includes a driving circuit, a storage circuit, and a reset circuit. The reset circuit is electrically connected to a first terminal of the driving circuit or a second terminal of the driving circuit and is used to initialize a potential at the first terminal of the driving circuit or a potential at the second terminal of the driving circuit in an initialization stage. The driving circuit is used to conduct a path between the first terminal of the driving circuit and the second terminal of the driving circuit under the control of a potential at a control terminal of the driving circuit. The storage circuit is electrically connected to the control terminal of the driving circuit and is used to store electrical energy. The reset circuit includes a first capacitor. The storage circuit includes a second capacitor. The first capacitor includes a first electrode plate and a second electrode plate disposed opposite to the first electrode plate. The second capacitor includes a first electrode plate and a second electrode plate disposed opposite to the first electrode plate. The first electrode plate of the first capacitor and the first electrode plate of the second capacitor are located in the first conductive layer. The second electrode plate of the first capacitor and the second electrode plate of the second capacitor are located in the second conductive layer. An orthographic projection of the first electrode plate of the first capacitor on the base substrate and an orthographic projection of the first electrode plate of the second capacitor on the base substrate are spaced from each other. An orthographic projection of the second electrode plate of the first capacitor on the base substrate and an orthographic projection of the second electrode plate of the second capacitor on the base substrate are spaced from each other. The orthographic projection of the first electrode plate of the first capacitor on the base substrate at least partially overlaps with the orthographic projection of the second electrode plate of the first capacitor on the base substrate. The orthographic projection of the first electrode plate of the second capacitor on the base substrate at least partially overlaps with the orthographic projection of the second electrode plate of the second capacitor on the base substrate. An area of the overlap between the orthographic projection of the first electrode plate of the first capacitor on the base substrate and the orthographic projection of the second electrode plate of the first capacitor on the base substrate is smaller than an area of the overlap between the orthographic projection of the first electrode plate of the second capacitor on the base substrate and the orthographic projection of the second electrode plate of the second capacitor on the base substrate. In the embodiments of the present disclosure, when the pixel driving circuit operates, before a data voltage is written into the driving circuit, the reset circuit initializes the potential at the first terminal of the driving circuit or the potential at the second terminal of the driving circuit in the initialization stage, so as to reduce the magnetic hysteresis of the driving circuit and solve the problem of residual image, flicker and other phenomena caused by the magnetic hysteresis of a driving transistor in a low-frequency state.

FIG. 1 is a schematic plan view of a display device according to some embodiments of the present disclosure. For example, the display device may be an OLED display device. With reference to FIG. 1, the display device 1000 may include a display panel 1100, a gate driver 1200, a data driver 1300, a controller 1400 and a voltage generator 1500. The display panel 1100 may include an array substrate 1000 and a plurality of pixels PX. The array substrate 1000 may include a display area AA and a non-display area NA, and the plurality of pixels PX are arranged in an array in the display area AA. A signal generated by the gate driver 1200 may be applied to the pixel PX through a signal line such as a scanning signal line GL. A signal generated by the data driver 1300 may be applied to the pixel PX through a signal line such as a data line DL. For example, a first voltage such as VDD and a second voltage such as VSS may be applied to the pixel PX. The first voltage such as VDD may be higher than the second voltage such as VSS. Optionally, the first voltage such as VDD may be applied to an anode of a light-emitting element (such as an OLED), and the second voltage such as VSS may be applied to a cathode of the light-emitting element, so that the light-emitting element may emit light.

For example, each pixel PX may include a plurality of sub-pixels, such as a red sub-pixel, a green sub-pixel and a blue sub-pixel. Alternatively, each pixel PX may include a white sub-pixel, a red sub-pixel, a green sub-pixel and a blue sub-pixel.

Figure 2:
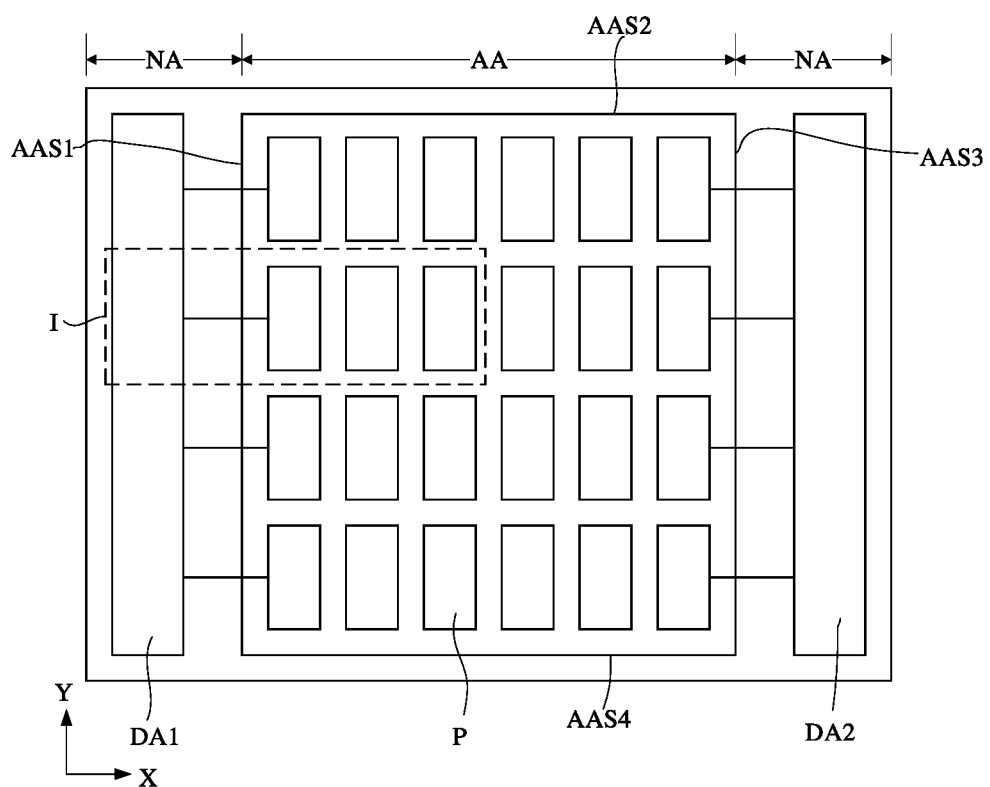
FIG. 2 is a schematic plan view of a display substrate included in a display device according to some embodiments of the present disclosure.

FIG. 2 is a schematic plan view of a display substrate included in a display device according to some embodiments of the present disclosure. For example, the display substrate may be an array substrate for an OLED display panel.

With reference to FIG. 2, the display substrate may include a display area AA and a non-display area NA. For example, the display area AA and the non-display area NA may include a plurality of boundaries, such as AAS1, AAS2, AAS3 and AAS4 as shown in FIG. 2. The display substrate may further include a driver located in the non-display area NA. For example, the driver may be located on at least one side of the display area AA. In the embodiment shown in FIG. 2, drivers are respectively located on a left side of the display area AA and a right side of the display area AA. It will be noted that the left side and the right side may be respectively a left side of the display substrate (screen) and a right side of the display substrate (screen) viewed by human eyes during the display. The driver may be used to drive each pixel in the display substrate for display. For example, the driver may include the gate driver 1200 and the data driver 1300 mentioned above. The data driver 1300 is used to latch input data based on timings of clock signals sequentially, convert the latched data into analog signals, and then input the analog signals to the respective data lines of the display substrate. The gate driver 1200 is usually implemented by shift registers, which convert clock signals into on/off voltages and respectively output the on/off voltages to the respective scanning signal lines of the display substrate.

It will be noted that although the drivers shown in FIG. 2 are located on the left side of the display area AA and the right side of the display area AA, the embodiments of the present disclosure are not limited to this. The driving circuit may be located at any suitable position in the non-display area NA.

For example, the driver may adopt a GOA technology, i.e., Gate Driver on Array. According to the GOA technology, a gate driving circuit is directly provided on the array substrate instead of an external driving chip. Each GOA unit serves as a stage of shift register, and each stage of shift register is connected to a gate line. Turn-on voltages are sequentially output by the respective stages of shift register in turn to scan the pixels row by row. In some embodiments, each stage of shift register may also be connected to a plurality of gate lines, which may adapt to a development trend of high resolution and narrow bezel of the display substrate.

With reference to FIG. 2, a left GOA circuit DA1, a plurality of pixels P in the display area AA and a right GOA circuit DA2 are provided in the display substrate. Each of the left GOA circuit DA1 and the right GOA circuit DA2 is electrically connected to a display IC through a signal line, where the display IC is configured to control a supply of GOA signals. For example, the display IC is disposed on a lower side (an observation direction of human eyes) of the display substrate. The left GOA circuit DA1 and the right GOA circuit DA2 are further electrically connected to the respective pixels through signal lines (such as the scanning signal lines GL) to supply driving signals to the pixels.

It will be noted that the figure shows that a shape of an orthographic projection of a sub-pixel on the base substrate is a rounded rectangle. However, the embodiments of the present disclosure are not limited to this. For example, the shape of the orthographic projection of the sub-pixel on the base substrate may be a rectangle, hexagon, pentagon, square, circle or other shapes. Moreover, an arrangement of three sub-pixels in a pixel unit is not limited to the arrangement shown in FIG. 1 and FIG. 2.

With reference to FIG. 1 and FIG. 2, each pixel unit PX may include a plurality of sub-pixels, such as a first sub-pixel SP1, a second sub-pixel SP2 and a third sub-pixel SP3. For convenience of understanding, the first sub-pixel SP1, the second sub-pixel SP2 and the third sub-pixel SP3 may be described as red sub-pixels, green sub-pixels and blue sub-pixels respectively. However, the embodiments of the present disclosure are not limited to this.

The plurality of sub-pixels are arranged in an array along a row direction X and a column direction Y on the base substrate 1. It will be noted that although in the illustrated embodiments, the row direction X and the column direction Y are perpendicular to each other, the embodiments of the present disclosure are not limited to this.

It will be understood that in the embodiments of the present disclosure, each sub-pixel includes a pixel driving circuit and a light-emitting element. For example, the light-emitting element may be an OLED light-emitting element including an anode, a light-emitting layer and a cathode which are stacked. The pixel driving circuit may include a plurality of thin film transistors and at least one storage capacitor.

Figure 3:
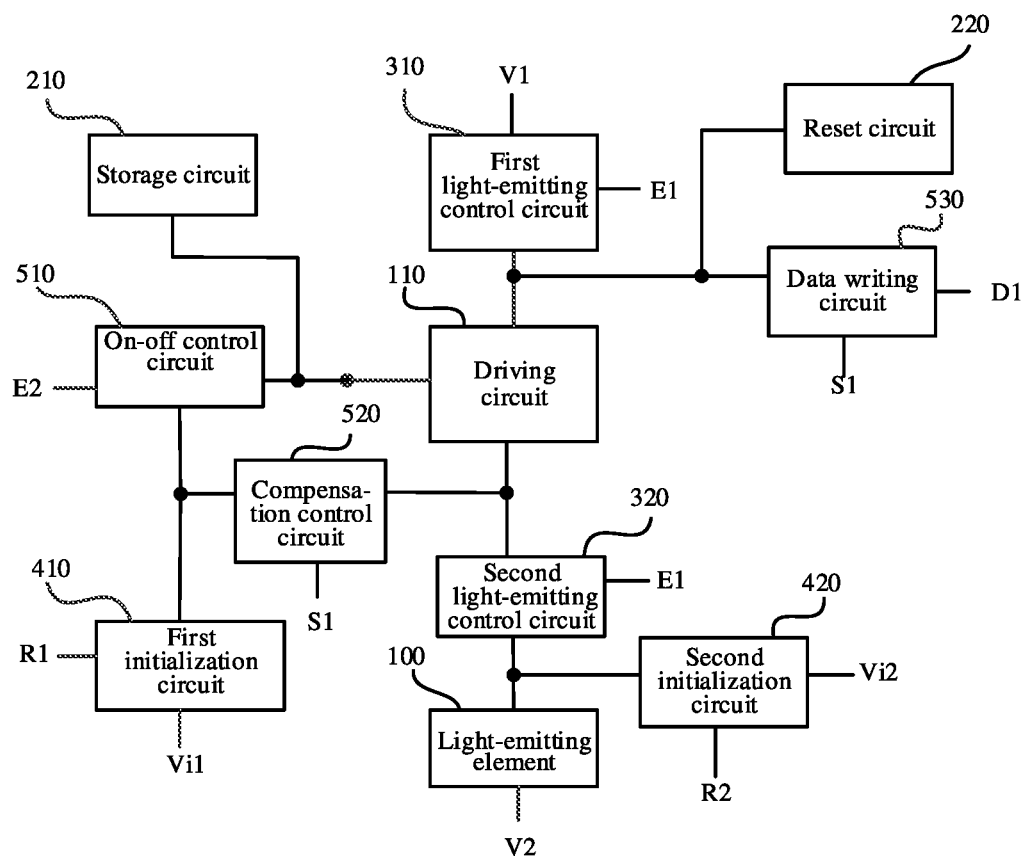
FIG. 3 is a block diagram of a structure of a pixel driving circuit according to some embodiments of the present disclosure.
Figure 4:
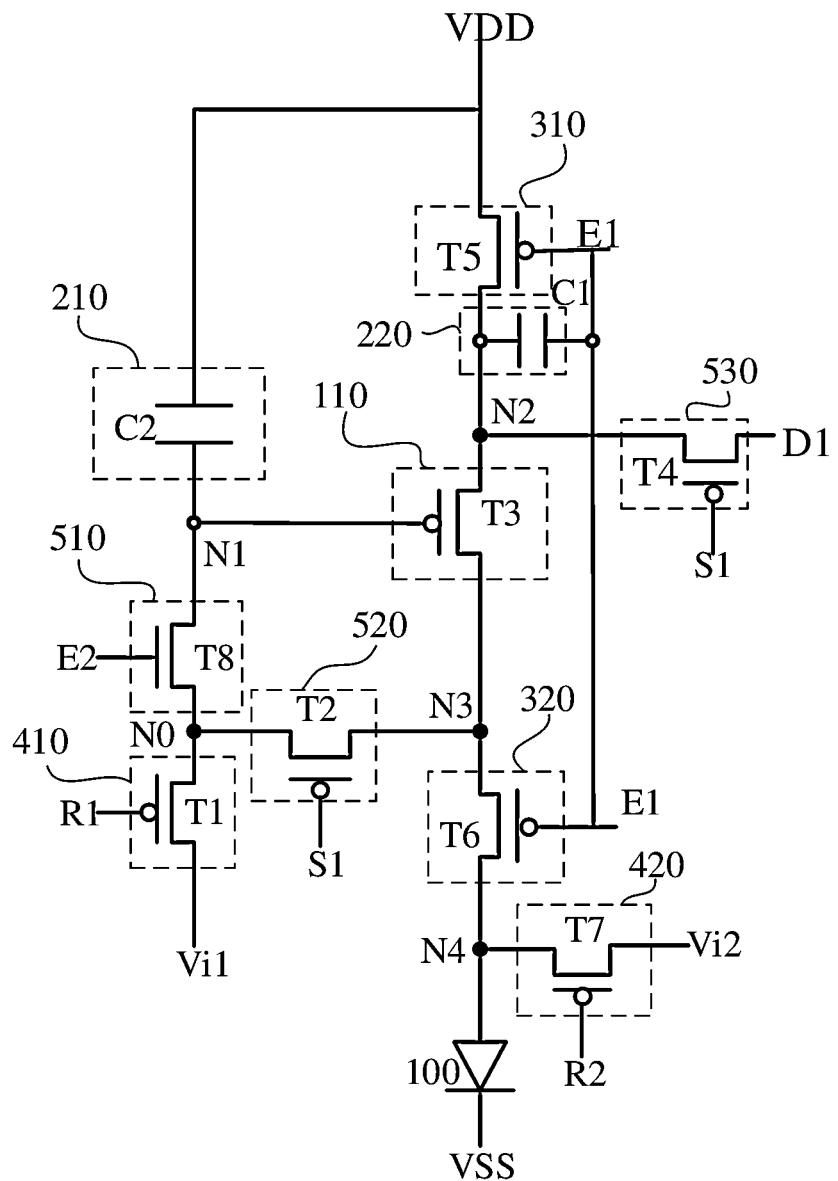
FIG. 4 is an equivalent circuit diagram of a pixel driving circuit according to some embodiments of the present disclosure.

FIG. 3 is a block diagram of a structure of a pixel driving circuit according to some embodiments of the present disclosure. FIG. 4 is an equivalent circuit diagram of a pixel driving circuit according to some embodiments of the present disclosure. It will be noted that in the following explanation, a structure of the pixel driving circuit will be described in detail by taking an 8T2C pixel driving circuit as an example. However, the embodiments of the present disclosure are not limited to the 8T2C pixel driving circuit. Without conflict, other known structures of a pixel driving circuit may be applied to the embodiments of the present disclosure.

As shown in FIG. 3, the pixel driving circuit according to the embodiments of the present disclosure is used to drive a light-emitting element 100. The pixel driving circuit includes a driving circuit 110 and a reset circuit 220. The reset circuit 220 is electrically connected to a first terminal of the driving circuit 110 and is used to initialize a potential at the first terminal of the driving circuit 110 in an initialization stage. The driving circuit 110 is used to conduct a path between the first terminal of the driving circuit 110 and the second terminal of the driving circuit 110 under the control of a potential at a control terminal of the driving circuit.

In the embodiments of the present disclosure, when the pixel driving circuit operates, before a data voltage is written into the driving circuit, the reset circuit initializes the potential at the first terminal of the driving circuit or the potential at the second terminal of the driving circuit in the initialization stage, so as to reduce the magnetic hysteresis of the driving transistor and solve the problem of residual image, flicker and other phenomena caused by the magnetic hysteresis of a driving transistor in a low-frequency state.

With continued reference to FIG. 3, the pixel driving circuit further includes a first light-emitting control circuit 310 and a second light-emitting control circuit 320.

The first light-emitting control circuit 310 is electrically connected to each of a first light-emitting control line E1, the first terminal of the driving circuit 11 and a first voltage line V1. The first light-emitting control circuit 310 is used to conduct a path between the first terminal of the driving circuit 11 and the first voltage line V1 under the control of a first light-emitting control signal provided by the first light-emitting control line E1.

A second light-emitting control circuit 320 is electrically connected to a second light-emitting control line E2, the second terminal of the driving circuit 11 and a first electrode of the light-emitting element 100. The second light-emitting control circuit 320 is used to conduct a path between the second terminal of the driving circuit 110 and the first electrode of the light-emitting element 100 under the control of a second light-emitting control signal provided by the second light-emitting control line E2.

A second electrode of the light-emitting element 100 is electrically connected to a second voltage line V2.

In the embodiments of the present disclosure, when the pixel driving circuit operates, in a light-emitting stage, the first light-emitting control circuit 310 conducts a path between the first terminal of the driving circuit 110 and the first voltage line V1 under the control of the first light-emitting control signal, and the second light-emitting control circuit 320 conducts a path between the second terminal of the driving circuit 110 and the first electrode of the light-emitting element 100 under the control of the second light-emitting control signal.

With reference to FIG. 3 and FIG. 4, the pixel driving circuit further includes a reset circuit 20. The reset circuit 20 may include a first capacitor C1. The first capacitor C1 may include a first electrode plate C1a and a second electrode plate C1b.

The first electrode plate of the first capacitor C1 is electrically connected to the first light-emitting control line E1, and the second electrode plate of the first capacitor C1 is electrically connected to the first terminal of the driving circuit 11.

In FIG. 4, a first node labeled N1 is electrically connected to the control terminal of the driving circuit 11, a second node labeled N2 is electrically connected to the first terminal of the driving circuit 11, and a third node labeled N3 is electrically connected to the second terminal of the driving circuit 11.

In the embodiments of the present disclosure, when the pixel driving circuit operates, in an initialization stage, a potential of the light-emitting control signal provided by E1 changes from a low voltage Vgl to a high voltage Vgh, N2 is in a floating state, and a potential at N2 changes as a potential at the first electrode plate of the first capacitor C1 changes. The potential at N2 changes to (V1+Vgh−Vgl). At this time, a gate-source voltage of the driving transistor in the driving circuit 110 is less than Vth (Vth being a threshold voltage of the driving transistor), and the driving transistor is in a conductive bias state, so as to reduce magnetic hysteresis of N2 caused by the floating.

In the embodiments of the present disclosure, when the pixel driving circuit operates, before the data writing, the driving transistor is in a conductive bias state, so as to ensure that the charging and compensation of the driving transistor in each pixel driving circuit start in the conduction bias state of the driving transistor, without being affected by a previous frame data voltage. In this way, it is possible to eliminate an influence of the magnetic hysteresis of the driving transistor, reduce residual image, and improve response time.

With continued reference to FIG. 3 and FIG. 4, the pixel driving circuit may further include a storage circuit 210, a data writing circuit 530, a compensation control circuit 520, an on-off control circuit 510, a first initialization circuit 410 and a second initialization circuit 420. The storage circuit 210 is electrically connected to the control terminal of the driving circuit 11, and used for storing electrical energy. The data writing circuit 530 is electrically connected to each of a scanning line S1, a data line D1 and the first terminal of the driving circuit 110, and used for writing the data voltage on the data line D1 into the first terminal of the driving circuit 110 under the control of a scanning signal provided by the scanning line S1. The on-off control circuit 510 is electrically connected to each of the scanning line S1, the control terminal of the driving circuit 110 and a connection node N0, and used for conducting a path between the control terminal of the driving circuit 110 and the connection node N0 under the control of the scanning signal. The compensation control circuit 520 is electrically connected to each of the scanning line S1, the connection node N0 and the second terminal of the driving circuit 110, and used for conducting a path between the connection node N0 and the second terminal of the driving circuit 110 under the control of the scanning signal provided by the scanning line S1. The first initialization circuit 410 is electrically connected to each of a reset control line R1, a first initial voltage line Vi1 and the connection node N0, and used for writing a first initial voltage provided by the first initial voltage line into the connection node N0 under the control of a reset control signal provided by the reset control line R1. The second initialization circuit 420 is electrically connected to each of a light-emitting element reset line R2, a second initial voltage line Vi2 and the first electrode of the light-emitting element 100, and used for writing a second initial voltage provided by the second initial voltage line into the first electrode of the light-emitting element 10 under the control of the reset control signal provided by the light-emitting element reset line R2.

In the embodiments of the present disclosure, when the pixel driving circuit operates, a display cycle may include an initialization stage, a data writing stage and a light-emitting stage, which are set in sequence.

In the initialization stage, the on-off control circuit 510 conducts a path between the control terminal of the driving circuit 110 and the connection node N0 under the control of the scanning signal, and the first initialization circuit 410 writes the first initial voltage to the connection node N0 under the control of the reset control signal, so as to write the first initial voltage to the control terminal of the driving circuit 110. The second initialization circuit 420 writes the second initial voltage provided by the second initial voltage line Vi2 to the first electrode of the light-emitting element 100 under control of the reset control signal provided by the light-emitting element reset line R2, so as to control the light-emitting element 100 to not emit light and purge residual charges from the first electrode of the light-emitting element 100.

In the data writing stage, the data writing circuit 530 writes the data voltage on the data line D1 to the first terminal of the driving circuit 110 under the control of the scanning signal, and the compensation control circuit 520 conduct the path between the connection node N0 and the second terminal of the driving circuit 110 under the control of the scanning signal. At a beginning of the data writing stage, the driving transistor in the driving circuit 110 is turned on, so as to charge the storage circuit by using the data voltage to change the potential at the control terminal of the driving circuit 110 until the driving transistor is turned off.

In the light-emitting stage, the first light-emitting control circuit 310 conducts the path between the first terminal of the driving circuit 110 and the first voltage line V1 under the control of the first light-emitting control signal, the second light-emitting control circuit 320 conducts the path between the second terminal of the driving circuit 110 and the first electrode of the light-emitting element 100 under the control of the second light-emitting control signal, and the driving circuit 110 drives the light-emitting element 100 to emit light.

For example, in the embodiment shown in FIG. 4, the reset circuit 220 includes the first capacitor C1. The first light-emitting control circuit 310 includes a fifth transistor T5. The second light-emitting control circuit 320 includes a sixth transistor T6. The on-off control circuit 510 includes an eighth transistor T8. The second initialization circuit 420 includes a seventh transistor T7. The first initialization circuit 410 includes a first transistor T1. The compensation control circuit 520 includes a second transistor T2. The data writing circuit 530 includes a fourth transistor T4. The driving circuit 110 includes the driving transistor T3. The storage circuit 210 includes a second capacitor C2. The light-emitting element is an organic light-emitting diode 100.

The first electrode plate of the first capacitor C1 is electrically connected to the light-emitting control line E1, and the second electrode plate of the first capacitor C1 is electrically connected to the node N2. That is, the second electrode plate of the first capacitor C1 is electrically connected to a second electrode of the fifth transistor T5 and a first electrode of the third transistor T3.

The first electrode plate of the second capacitor C2 is electrically connected to the node N1, and the second electrode plate of the second capacitor C2 is electrically connected to the first voltage line.

A gate of the first transistor T1 is electrically connected to the reset control line R1, A first electrode of the first transistor T1 is electrically connected to the first initial voltage line Vi1, and a second electrode of the first transistor T1 is electrically connected to the node N0. For example, the first initial voltage line Vi1 is used to provide the first initial voltage.

A gate of the second transistor T2 is electrically connected to the scanning line S1, a second electrode of the second transistor T2 is electrically connected to the node N3, and a first electrode of the second transistor T2 is electrically connected to the node N0. That is, the first electrode of the second transistor T2 is electrically connected to the second electrode of the first transistor T1 and a first electrode of the eighth transistor T8.

A gate of the third transistor T3 is electrically connected to the node N1, the first electrode of the third transistor T3 is electrically connected to the node N2, and a second electrode of the third transistor T3 is electrically connected to the node N3.

A gate of the fourth transistor T4 is electrically connected to the scanning line S1, a first electrode of the fourth transistor T4 is electrically connected to the data line D1, and a second electrode of the fourth transistor T4 is electrically connected to the node N2.

A gate of the fifth transistor T5 is electrically connected to the light-emitting control line E1, a first electrode of the fifth transistor T5 is electrically connected to the first voltage line V1, and the second electrode of the fifth transistor T5 is electrically connected to the first electrode of the third transistor T3. The first voltage line is used to provide a high voltage VDD.

A gate of the sixth transistor T6 is electrically connected to the light-emitting control line E1, and a first electrode of the sixth transistor T6 is electrically connected to the node N3. That is, the first electrode of the sixth transistor T6 is electrically connected to the second electrode of the third transistor T3 and the second electrode of the second transistor T2. A second electrode of the sixth transistor T6 is electrically connected to an anode of the organic light-emitting diode 100.

A gate of the seventh transistor T7 is electrically connected to the light-emitting element reset line R2, a first electrode of the seventh transistor T7 is electrically connected to the second initial voltage line Vi2, and a second electrode of the seventh transistor T7 is electrically connected to the node N4. That is, the second electrode of the seventh transistor T7 is electrically connected to the first electrode of the sixth transistor T6 and the anode of the organic light-emitting diode 100. For example, the second initial voltage line Vi2 is used to provide the second initial voltage, and the signal provided by the light-emitting element reset line R2 will be further described in detail in the following text.

A gate of the eighth transistor T8 is electrically connected to the second light-emitting control line E2, the first electrode of the eighth transistor T8 is electrically connected to the node N0, and a second electrode of the eighth transistor T8 is electrically connected to the node N1.

The anode of the organic light-emitting diode 100 is electrically connected to the node N4, and a cathode of the organic light-emitting diode 100 is electrically connected to the second voltage line. The second voltage line is used to provide a low voltage VSS.

In the embodiments of the present disclosure, the first light-emitting control line E1 applies the first light-emitting control signal to the gate of the fifth transistor T5, the gate of the sixth transistor T6, and the first electrode plate C1a of the first capacitor C1.

In the embodiments of the present disclosure, Vi2 may be the same as Vi1. Also, Vi1 may be different from Vi2.

In the embodiments of the present disclosure, the eighth transistor T8 may be an oxide thin film transistor, and other transistors T1 to T7 may be low temperature poly-silicon thin film transistors. However, the embodiments of the present disclosure are not limited by this.

According to at least one embodiment of the pixel driving circuit described in the present disclosure, a voltage value of Vi1 may be greater than or equal to −6V, and less than or equal to −2V. For example, the voltage value of Vi1 may be −2V, −3V, −4V, −5V, or −6V, etc., but not limited by this.

Threshold voltages Vth of the transistors may be greater than or equal to −5V, and less than or equal to −0.5V. For example, Vth may be −2.5V or −3V, or the like.

A voltage value of the high voltage VDD provided by the first voltage line may be greater than or equal to 3V, and less than or equal to 6V. For example, the voltage value of VDD may be 4.6V, but not limited by this.

An absolute value of the voltage value of the high voltage VDD may be greater than 1.5 times of an absolute value of Vth. For example, the absolute value of the voltage value of VDD may be 1.6 times, 1.8 times, 2 times of the absolute value of Vth, or the like.

Optionally, a voltage value of the low voltage VSS provided by the second voltage line may be greater than or equal to −6V, and less than or equal to −3V. For example, the voltage value of VSS may be −5V, −4V, or −3V.

In at least one embodiment of the present disclosure, the voltage value of Vi2 may be greater than or equal to −7V, and less than or equal to 0V. For example, the voltage value of the second initialization voltage may be −6V, −5V, −4V, −3V, or −2V, but not limited by this.

Optionally, a voltage difference between the voltage value of Vi2 and the voltage value of VSS needs to be less than a lightening voltage of the light-emitting element, so that when the first electrode of the light-emitting element receives Vi2, the light-emitting element does not emit light.

Figure 5:
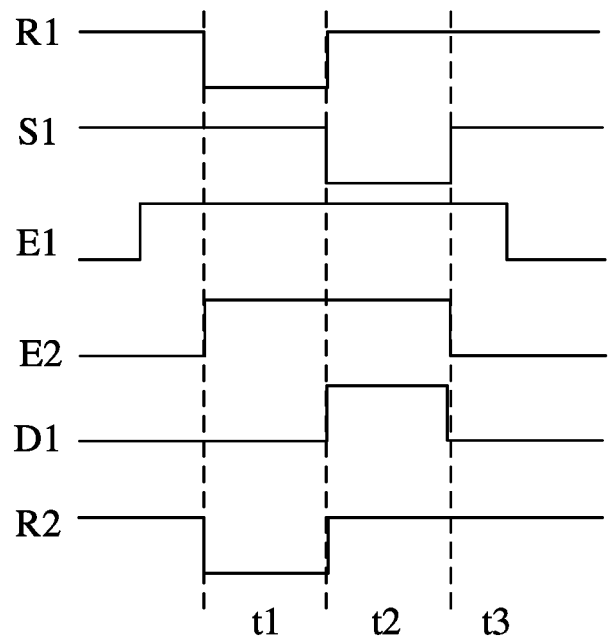
FIG. 5 is an operation timing diagram for at least one embodiment of the pixel driving circuit shown in FIG. 4.

FIG. 5 is an operation timing diagram for at least one embodiment of the pixel driving circuit shown in FIG. 4. With reference to FIG. 3 to FIG. 5, during the operation of the pixel driving circuit according to the embodiments of the present disclosure, a display cycle may include an initialization stage t1, a data writing stage t2 and a light-emitting stage t3 which are set in sequence.

In the initialization stage t1, the potential of the light-emitting control signal provided by the first light-emitting control line E1 is converted from the low voltage Vgl to the high voltage Vgh, the reset control line R1 provides a low voltage signal, the second light-emitting control line E2 provides a high voltage signal, and the scanning line S1 provides a high voltage signal. The transistor T6 and the transistor T4 are turned on, Vi1 is written to the node N1, and the potential at the node N2 is changed to VDD+(Vgh−Vgl). At this time, the gate-source voltage of the transistor T3 is less than the threshold voltage Vth of the transistor T3, so that the transistor T3 is in the conduction bias state; the transistor T5 is turned on, Vi2 is written to the anode of organic light-emitting diode 100, the organic light-emitting diode 100 does not emit light, and residual charges are purged from the anode of the organic light-emitting diode 100.

In the data writing stage t2, the reset control line R1 provides a high voltage signal, the second light-emitting control line E2 provides a high voltage signal, the scanning line S1 provides a low voltage signal, and the first light-emitting control line E1 provides a high voltage signal. The transistors T2, T4 and T8 are turned on, the data voltage Vdata on the data line D1 is written to the node N2, the path between the node N1 and the node N3 is conducted. The second capacitor C2 is charged by using Vdata, so as to change a potential at the gate of the transistor T3, and until the transistor T3 is turned off, the potential of the gate of the transistor T3 is changed to Vdata+Vth.

In the light-emitting stage t3, the reset control line R1 provides a high voltage signal, the second light-emitting control line E2 provides a low voltage signal, the scanning line S1 provides a high voltage signal, and the first light-emitting control line E1 provides a low voltage signal. The transistors T3, T5 and T6 are turned on, and the transistor T3 drives the organic light-emitting diode 100 to emit light. At this time, a light-emitting current of the organic light-emitting diode 100 is $0.5K(Vdata-VDD)^2$, where K is a current coefficient of the transistor T3.

In the embodiments of the present disclosure, a pulse width of the first light-emitting control signal provided by the first light-emitting control line E1 may be the same as a pulse width of the second light-emitting control signal provided by the second light-emitting control line E2. Alternatively, the pulse width of the first light-emitting control signal provided by the first light-emitting control line E1 may be larger than the pulse width of the second light-emitting control signal provided by the second light-emitting control line E2 by a predetermined time.

When the pulse width of the first light-emitting control signal provided by the first light-emitting control line E1 may be the same as the pulse width of the second light-emitting control signal provided by the second light-emitting control line E2, in the initialization stage, the transistors T5 and T6 may fail to be turned off correctly. Based on this, in at least one embodiment of the present disclosure, the pulse width of the first light-emitting control signal provided by the first light-emitting control line E1 may be larger than the pulse width of the second light-emitting control signal provided by the second light-emitting control line E2 by the predetermined time. The predetermined time may be less than or equal to 0.5H, and 1H is the time for scanning one row. In this way, in the initialization stage, under the control of the first light-emitting control signal, the transistors T5 and T6 are turned off, so as to disconnect the path between the first voltage line and the first electrode of the transistor T3 and the path between the second electrode of the transistor T3 and the anode of the organic light-emitting diode 100, so that the organic light-emitting diode 100 does not emit light, which does not affect light-emitting.

In the embodiments of the present disclosure, the transistor T8 included in the on-off control circuit may be an oxide thin film transistor. In this way, a leakage of the control terminal of the driving circuit may be reduced, so as to ensure a stability of the voltage of the control terminal of the driving circuit during a low-frequency operation, thereby improving display quality and display uniformity, and reducing flicker.

In the embodiments of the present disclosure, the transistor T7 may be controlled by a separate GOA, which is electrically connected to the light-emitting element reset line R2, so as to permit the organic light-emitting diode 100 to be reset at a frequency of 60 Hz.

Figure 6A:
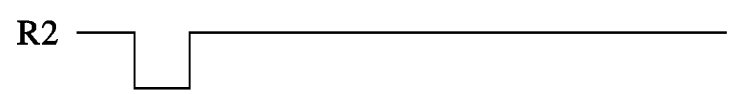
FIG. 6A and FIG. 6B are each a schematic diagram of a signal provided by a light-emitting element reset line according to some exemplary embodiments of the present disclosure.
Figure 6B:

FIG. 6A and FIG. 6B are each a schematic diagram of a signal provided by a light-emitting element reset line according to some exemplary embodiments of the present disclosure. With reference to FIG. 6A and FIG. 6B, in the embodiments of the present disclosure, the signal provided by the light-emitting element reset line R2 may be a high-frequency signal. For example, the frequency of the signal provided by the light-emitting element reset line R2 may be higher than the frequency of the reset control signal provided by the reset control line R1. The frequency of the signal provided by the light-emitting element reset line R2 shown in FIG. 6B is higher than the frequency of the signal provided by the light-emitting element reset line R2 shown in FIG. 6A. In the embodiment shown in FIG. 6A, the frequency of the signal provided by the light-emitting element reset line R2 is substantially equal to the frequency of the reset control signal provided by the reset control line R1.

Figure 23:
FIG. 23 is a diagram of a luminescence effect of a light-emitting element when using a high-frequency signal shown in FIG. 6B.

FIG. 23 is a diagram of a luminescence effect of a light-emitting element when using a high-frequency signal shown in FIG. 6B. With reference to FIG. 23, by increasing the frequency of the signal provided by the light-emitting element reset line R2, a refresh frequency of the reset of the anode of the light-emitting element may be increased, so that a brightness establishment time of a refreshing stage of the light-emitting element is consistent with a brightness establishment time of a maintaining stage of the light-emitting element. In this way, it is possible to reduce a low component of the light-emitting maintaining stage, visible brightness changes and the flicker level, while reducing load and power consumption.

It will be noted that in the embodiments of the present disclosure, each thin film transistor T1, T2, T3, T4, T5, T6, T7 and T8 may be a p-channel field-effect transistor. However, the embodiments of the present disclosure is not limited thereto, and at least some of the thin film transistors T1, T2, T3, T4, T5, T6, T7 and T8 may be n-channel field-effect transistors.

Figure 7:
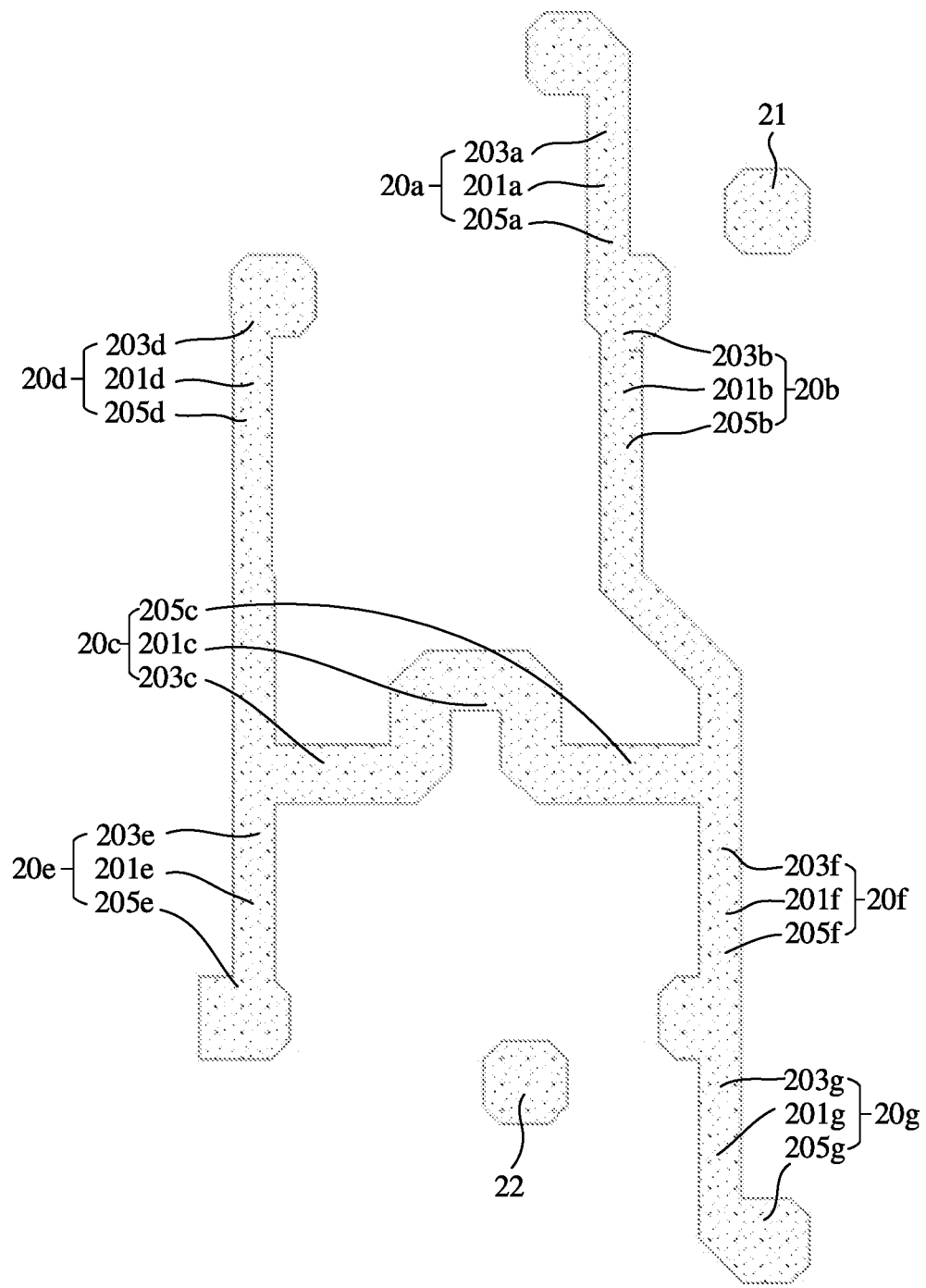
FIG. 7 is a schematic plane configuration view of a first semiconductor layer of a pixel driving circuit according to an exemplary embodiment of the present disclosure.
Figure 8:
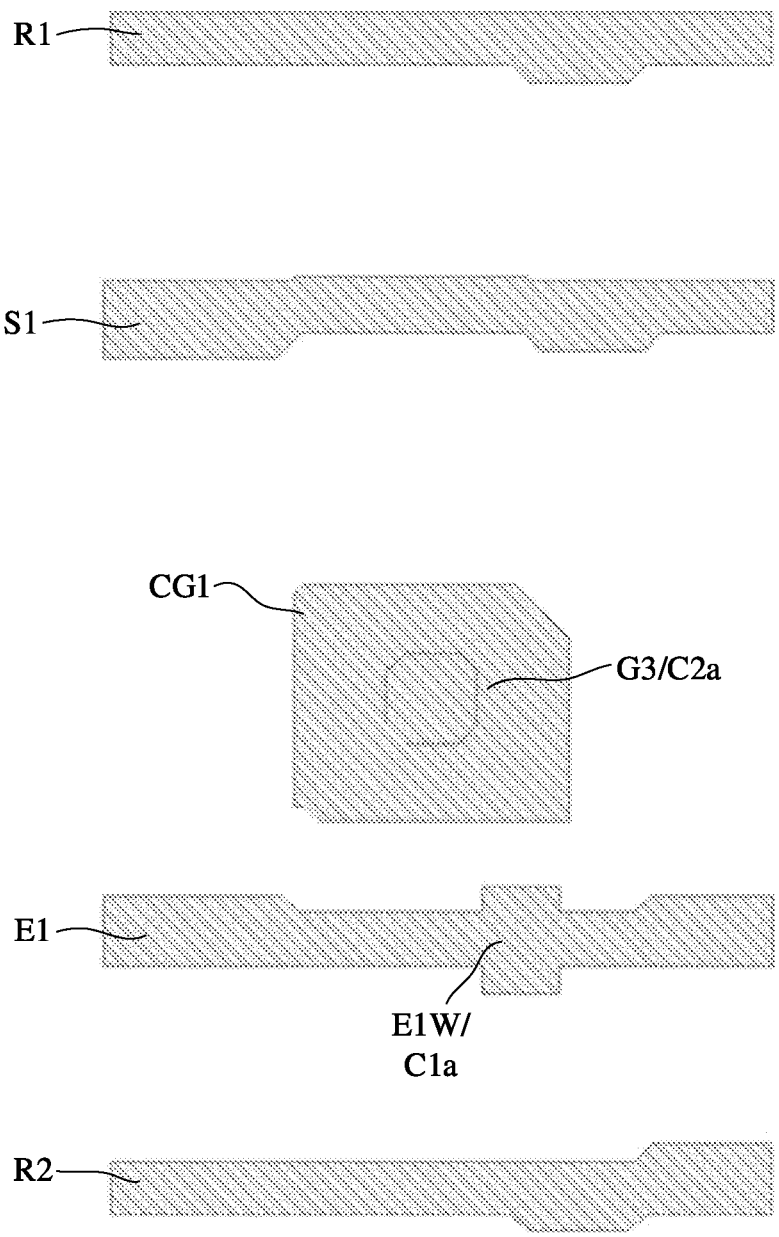
FIG. 8 is a schematic plane configuration view of a first conductive layer of a pixel driving circuit according to an exemplary embodiment of the present disclosure.
Figure 9:
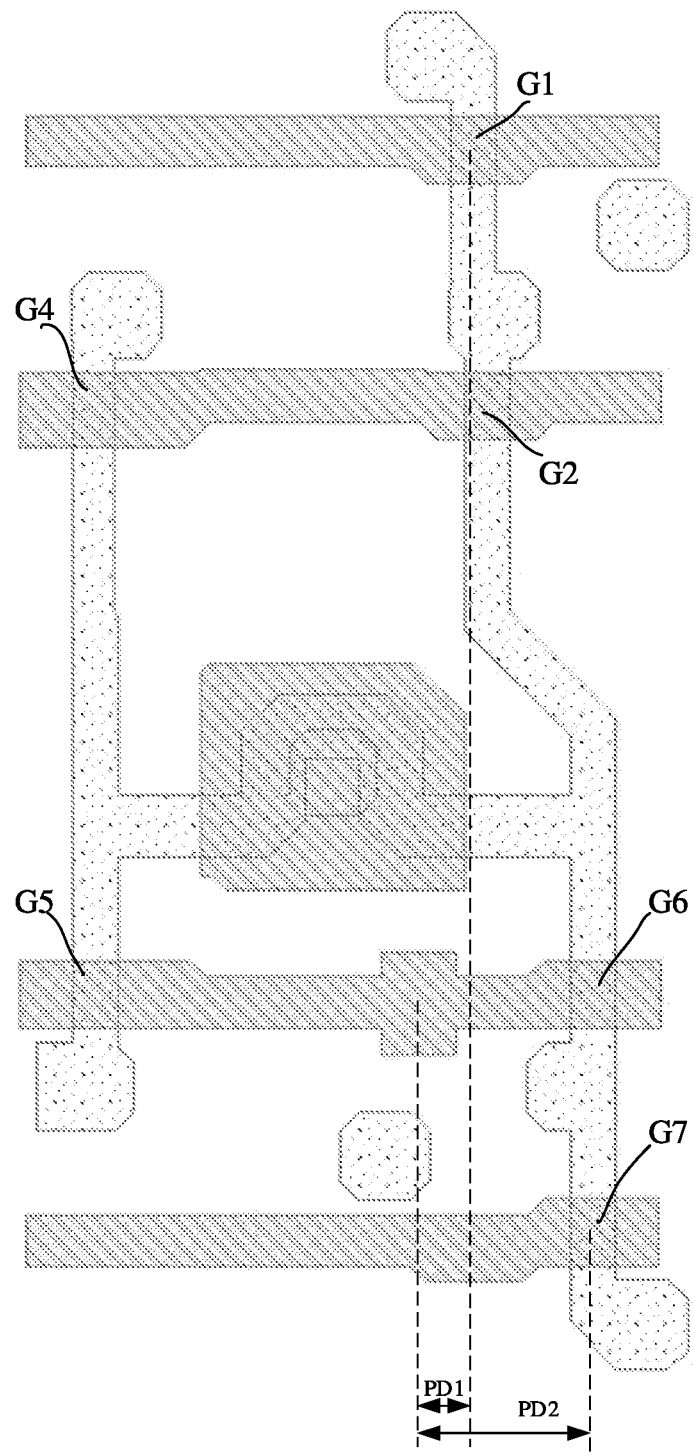
FIG. 9 is a schematic plane configuration view of a combination of a first semiconductor layer of a pixel driving circuit and a first conductive layer of the pixel driving circuit according to an exemplary embodiment of the present disclosure.
Figure 10:
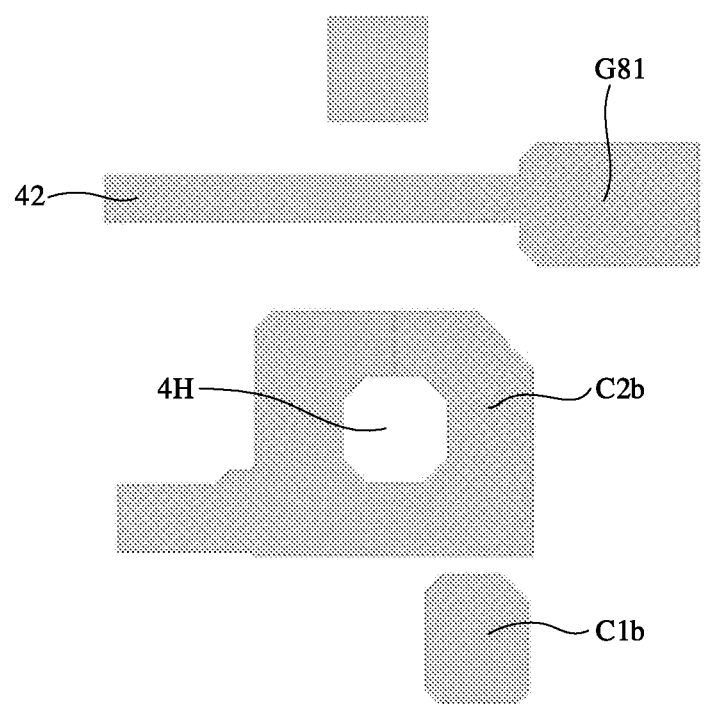
FIG. 10 is a schematic plane configuration view of a second conductive layer of a pixel driving circuit according to an exemplary embodiment of the present disclosure.
Figure 11:
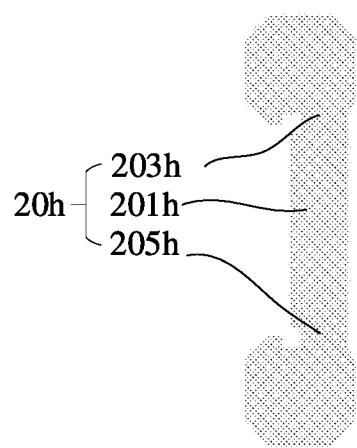
FIG. 11 is a schematic plane configuration view of a second semiconductor layer of a pixel driving circuit according to an exemplary embodiment of the present disclosure.
Figure 12:
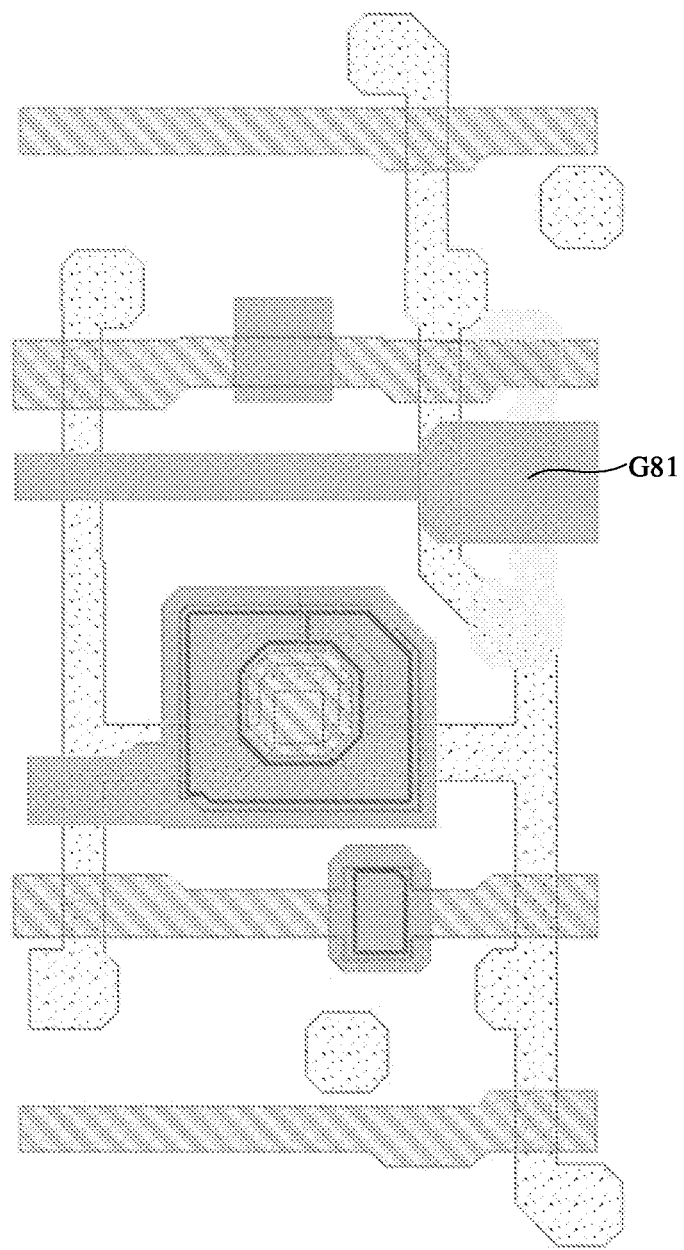
FIG. 12 is a schematic plane configuration view of a combination of a first semiconductor layer, a first conductive layer, a second conductive layer and a second semiconductor layer of a pixel driving circuit according to an exemplary embodiment of the present disclosure.
Figure 13:
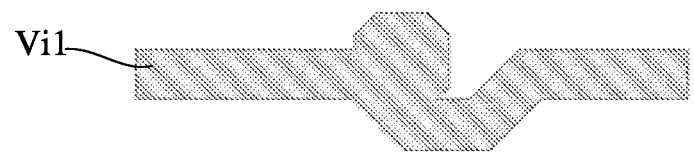
FIG. 13 is a schematic plane configuration view of a third conductive layer of a pixel driving circuit according to an exemplary embodiment of the present disclosure.
Figure 13:
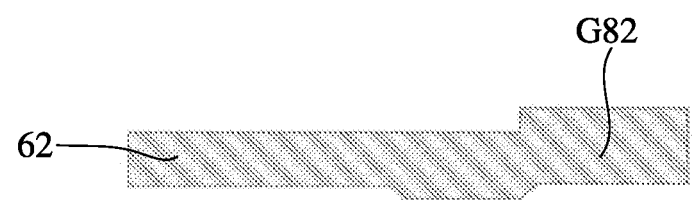
Figure 13:
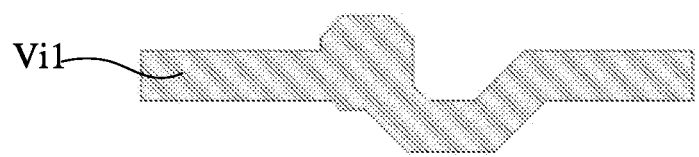
Figure 14:
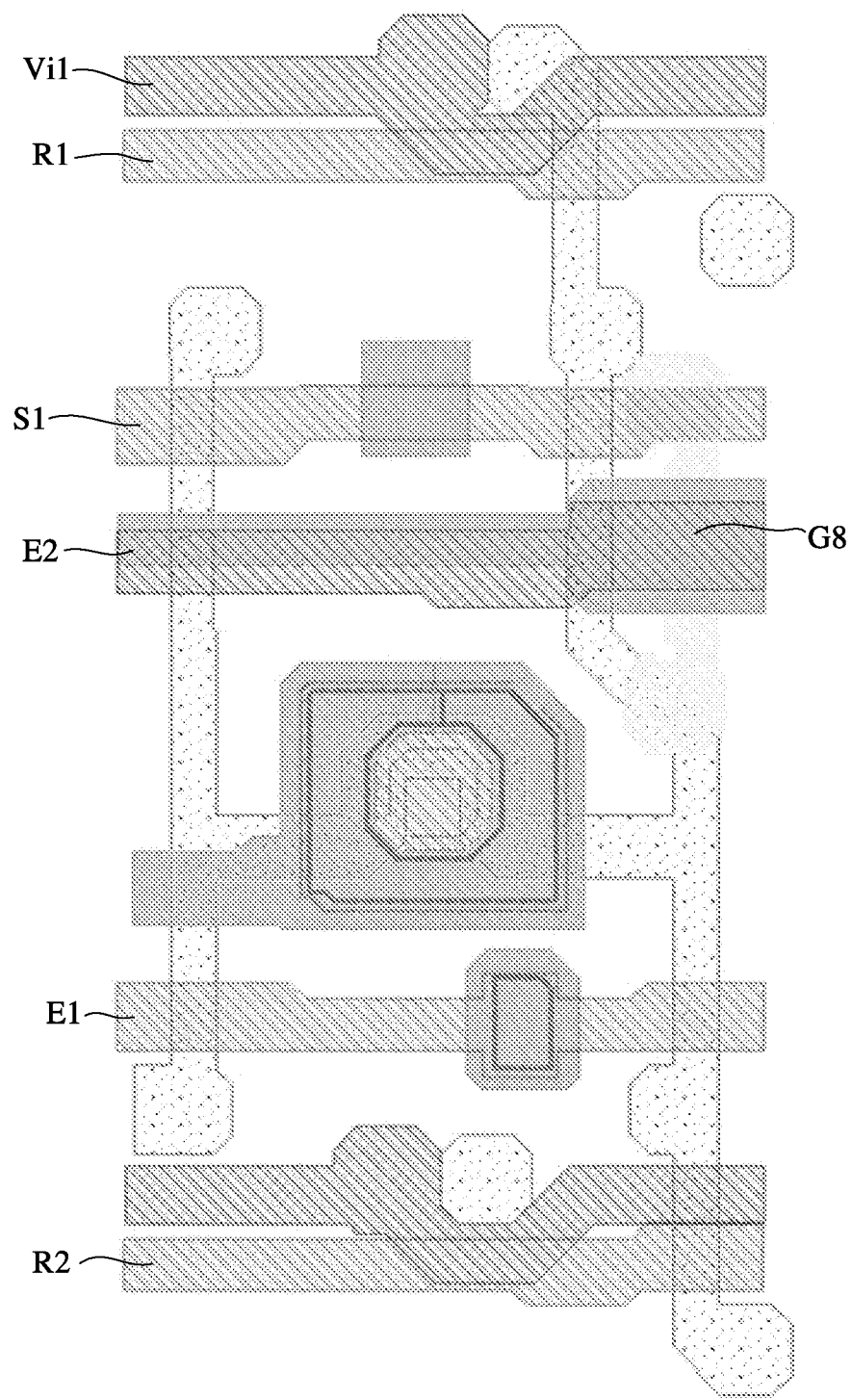
FIG. 14 is a schematic plane configuration view of a combination of a first semiconductor layer, a first conductive layer, a second conductive layer, a second semiconductor layer and a third conductive layer of a pixel driving circuit according to an exemplary embodiment of the present disclosure.
Figure 15:
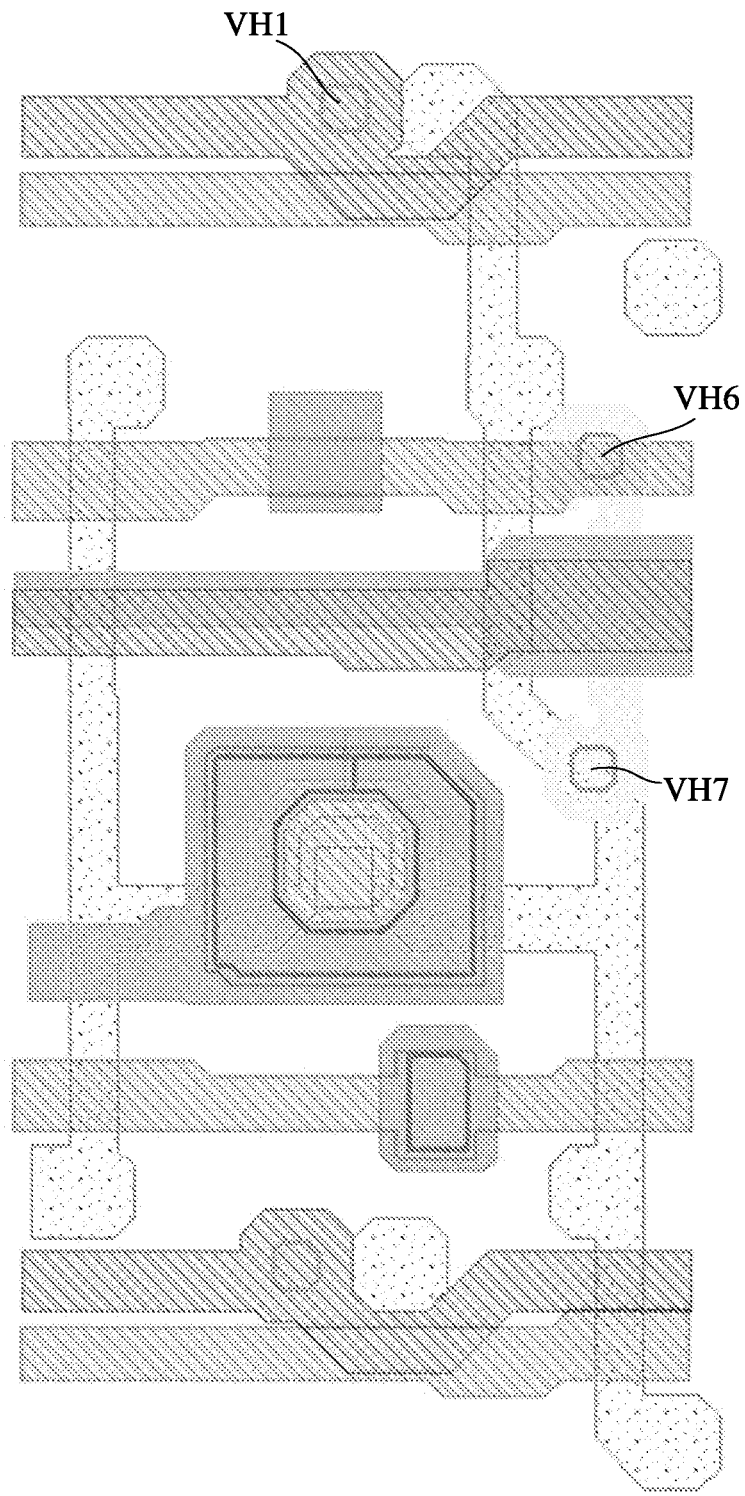
FIG. 15 is a schematic diagram showing via holes in an insulation layer formed on the structure in FIG. 14.
Figure 16:
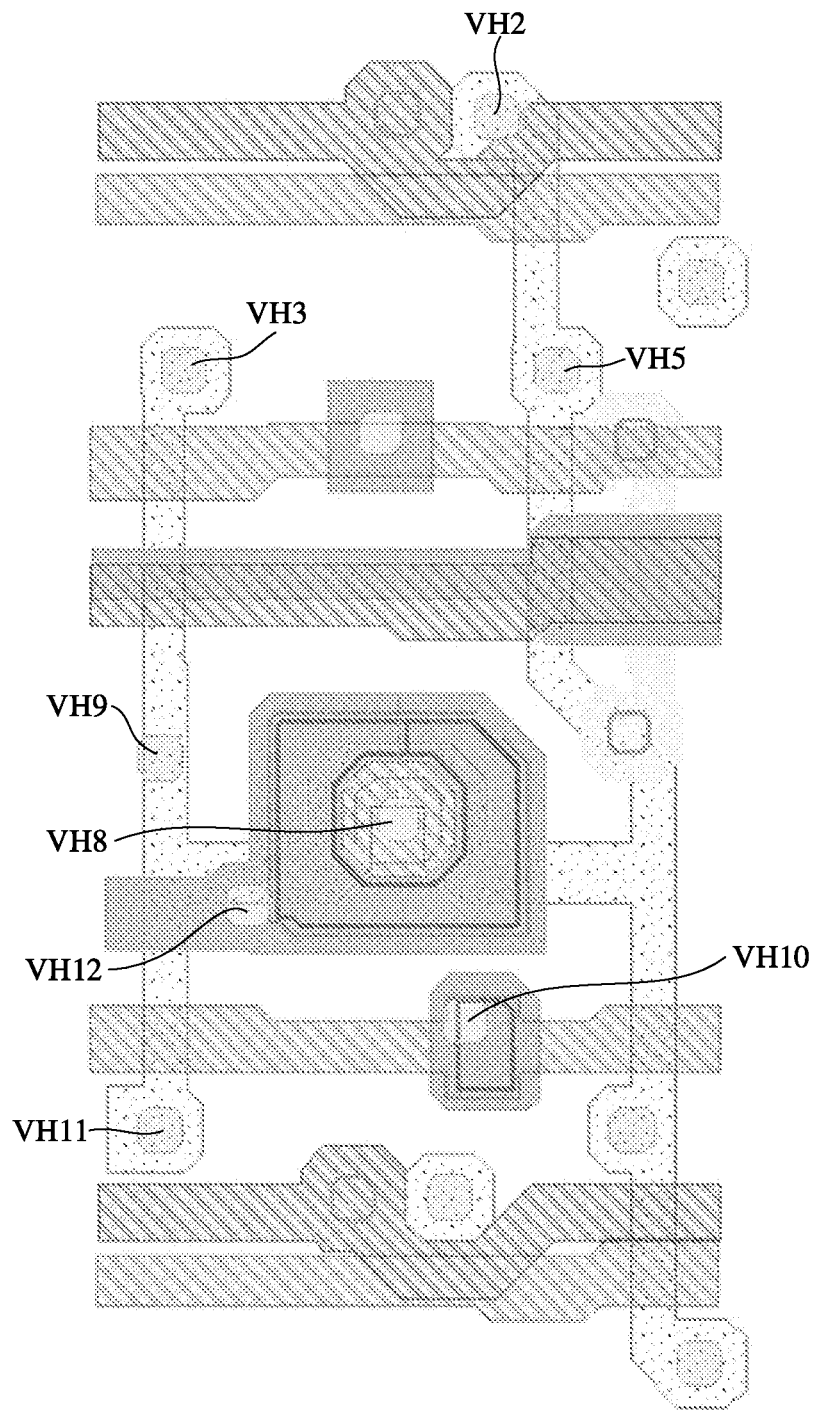
FIG. 16 is a schematic diagram showing via holes in an insulation layer formed on the structure in FIG. 15.
Figure 17:
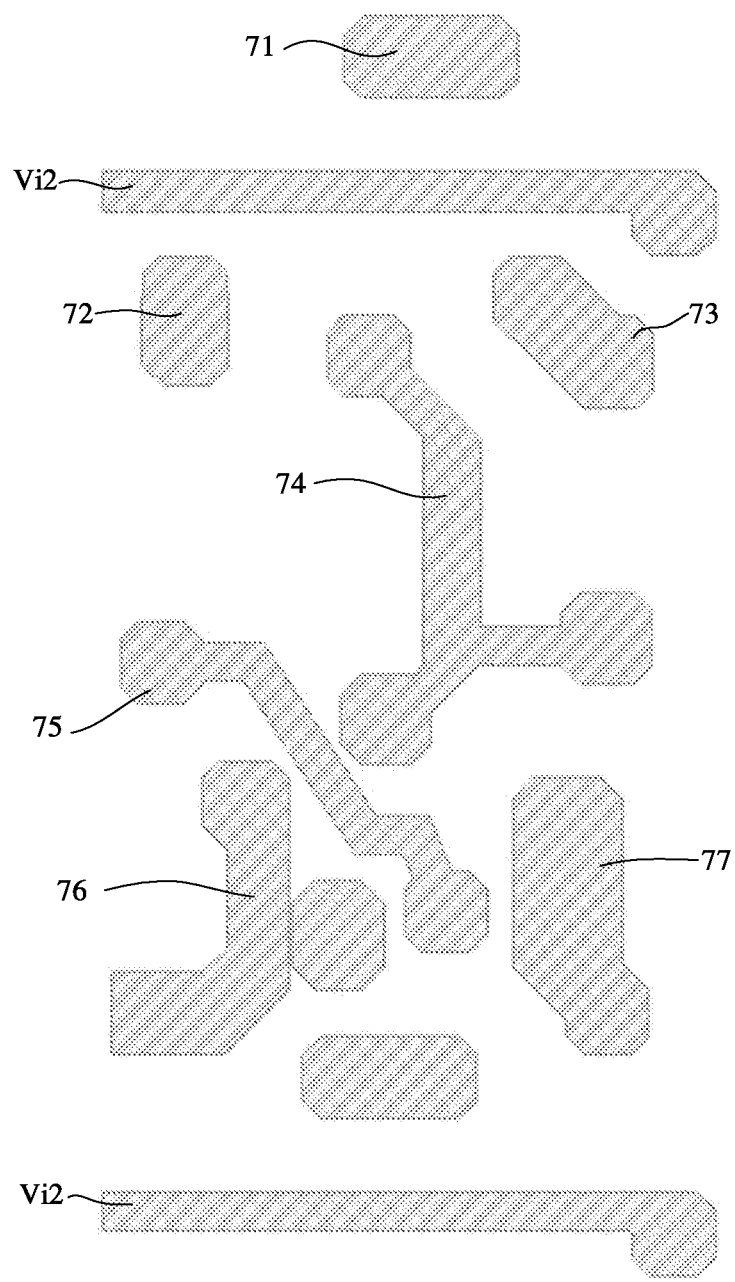
FIG. 17 is a schematic plane configuration view of a fourth conductive layer of a pixel driving circuit according to an exemplary embodiment of the present disclosure.
Figure 18:
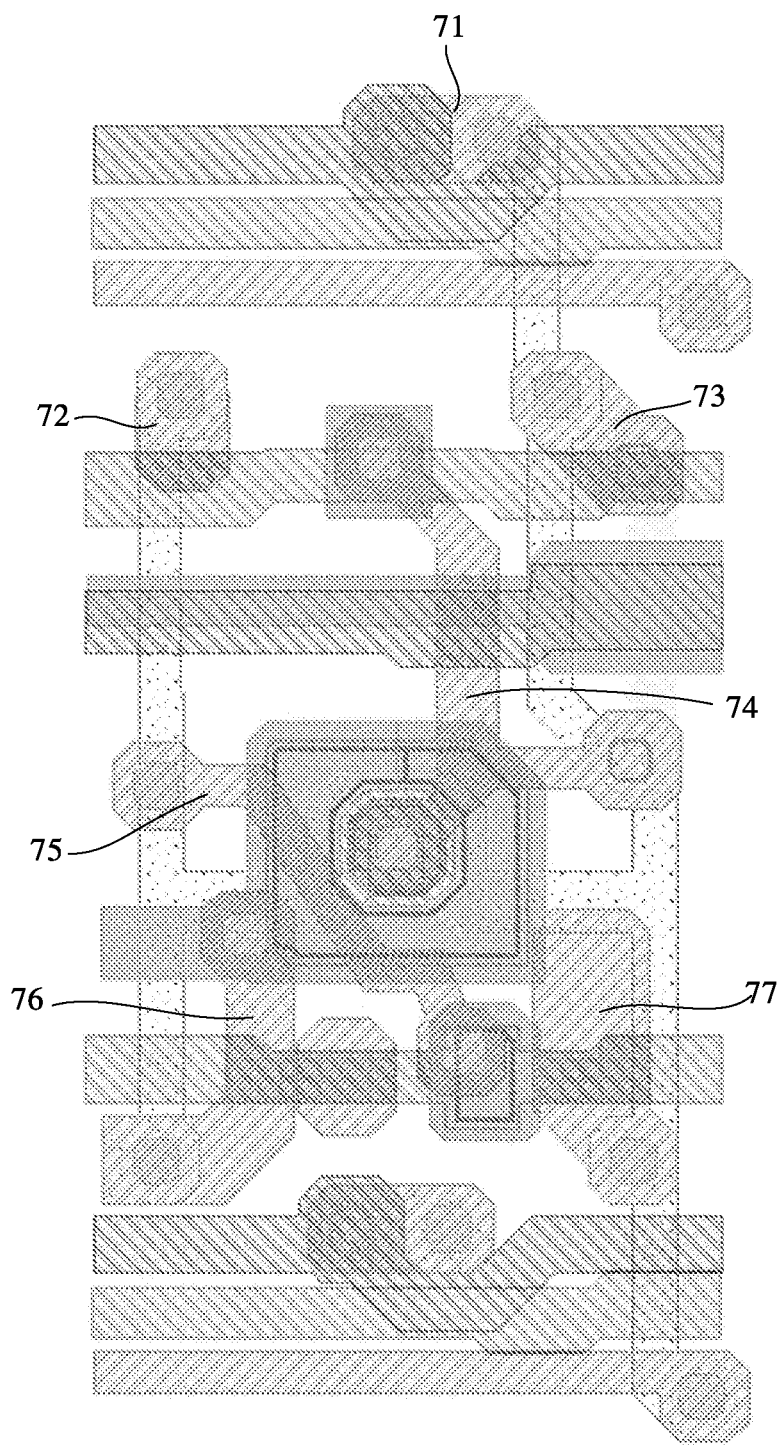
FIG. 18 is a schematic plane configuration view of a combination of a first semiconductor layer, a first conductive layer, a second conductive layer, a second semiconductor layer, a third conductive layer and a fourth conductive layer of a pixel driving circuit according to an exemplary embodiment of the present disclosure.
Figure 19:
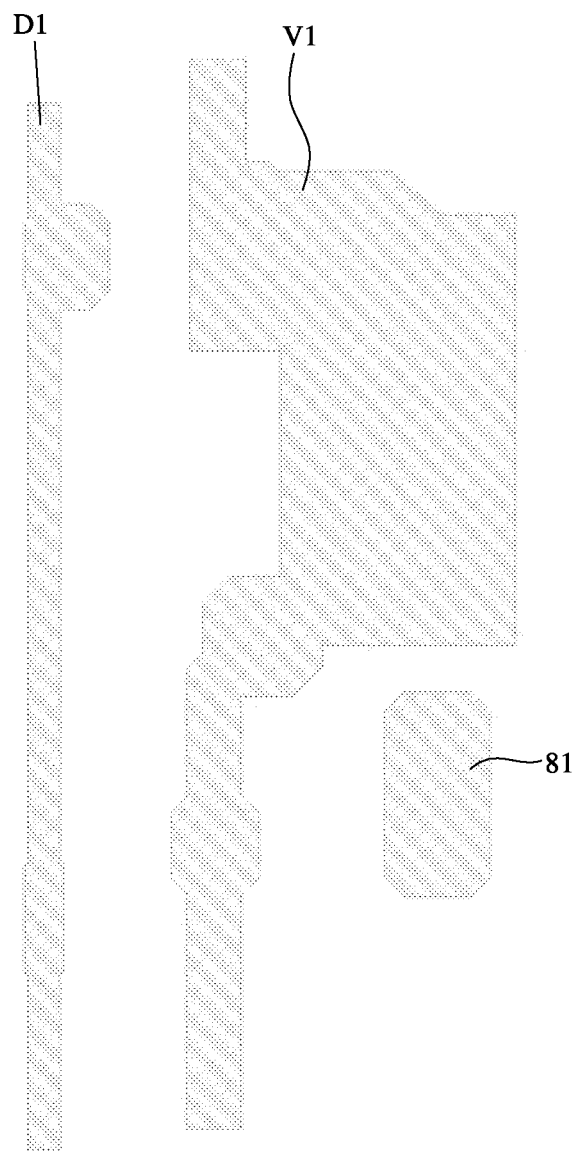
FIG. 19 is a schematic plane configuration view of a fifth conductive layer of a pixel driving circuit according to an exemplary embodiment of the present disclosure.
Figure 20:
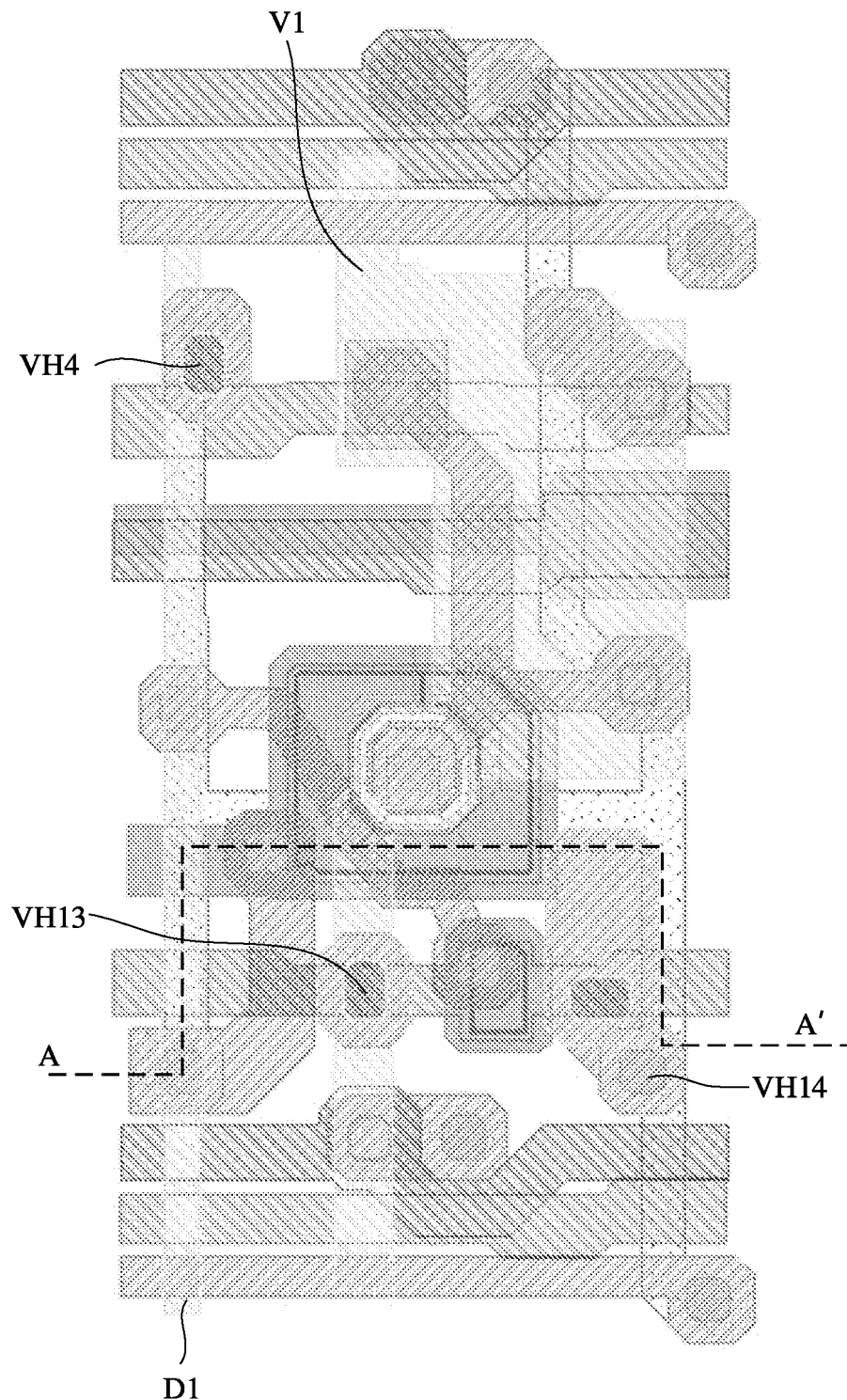
FIG. 20 is a schematic plane configuration view of a combination of a first semiconductor layer, a first conductive layer, a second conductive layer, a second semiconductor layer, a third conductive layer, a fourth conductive layer and a fifth conductive layer of a pixel driving circuit according to an exemplary embodiment of the present disclosure.
Figure 21:
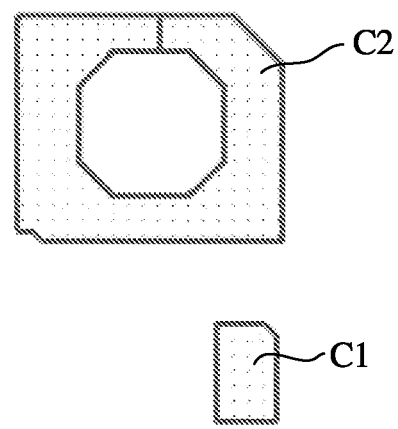
FIG. 21 is a plan view schematically showing an overlapping area of a first capacitor and a second capacitor.
Figure 22:
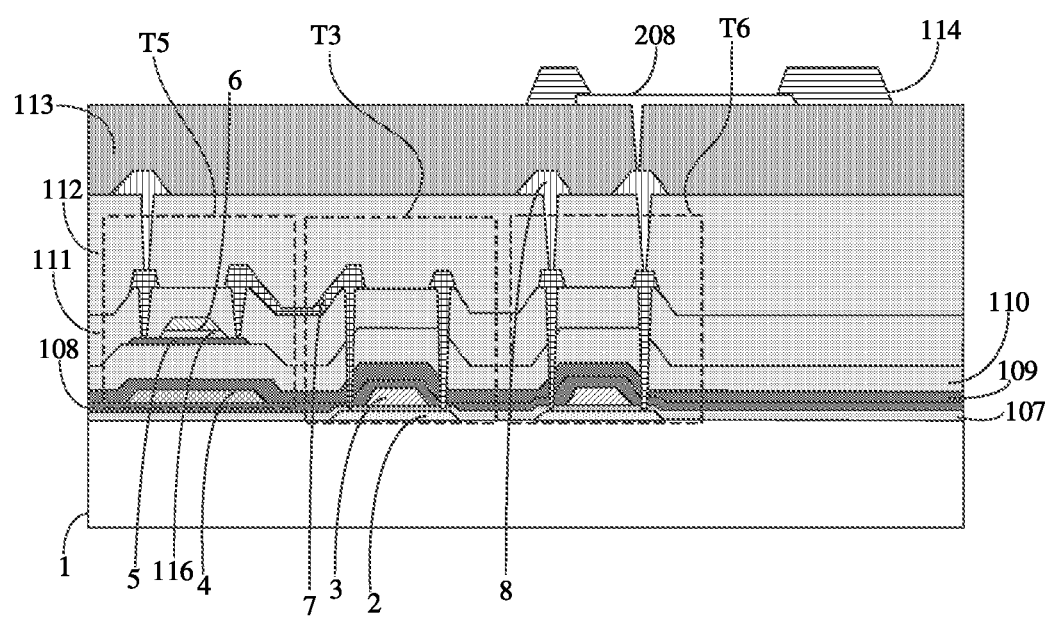
FIG. 22 is a schematic diagram showing a sectional structure of a display substrate taken along line AA' in FIG. 20 according to some exemplary embodiments of the present disclosure.

FIG. 7 is a schematic plane configuration view of a first semiconductor layer of a pixel driving circuit according to an exemplary embodiment of the present disclosure. FIG. 8 is a plane configuration view of a first conductive layer of a pixel driving circuit according to an exemplary embodiment of the present disclosure. FIG. 9 is a schematic plane configuration view of a combination of a first semiconductor layer of a pixel driving circuit and a first conductive layer of the pixel driving circuit according to an exemplary embodiment of the present disclosure. FIG. 10 is a schematic plane configuration view of a second conductive layer of a pixel driving circuit according to an exemplary embodiment of the present disclosure. FIG. 11 is a schematic plane configuration view of a second semiconductor layer of a pixel driving circuit according to an exemplary embodiment of the present disclosure. FIG. 12 is a schematic plane configuration view of a combination of a first semiconductor layer of a pixel driving circuit, a first conductive layer of the pixel driving circuit, a second conductive layer of the pixel driving circuit and a second semiconductor layer of the pixel driving circuit according to an exemplary embodiment of the present disclosure. FIG. 13 is a schematic plane configuration view of a third conductive layer of a pixel driving circuit according to an exemplary embodiment of the present disclosure. FIG. 14 is a schematic plane configuration view of a combination of a first semiconductor layer of a pixel driving circuit, a first conductive layer of the pixel driving circuit, a second conductive layer of the pixel driving circuit, a second semiconductor layer of the pixel driving circuit and a third conductive layer of the pixel driving circuit according to an exemplary embodiment of the present disclosure. FIG. 15 is a schematic diagram showing via holes in an insulation layer formed on the structure in FIG. 14. FIG. 16 is a schematic diagram showing via holes in an insulation layer formed on the structure in FIG. 15. FIG. 17 a schematic plane configuration view of a fourth conductive layer of a pixel driving circuit according to an exemplary embodiment of the present disclosure. FIG. 18 is a schematic plane configuration view of a combination of a first semiconductor layer of a pixel driving circuit, a first conductive layer of the pixel driving circuit, a second conductive layer of the pixel driving circuit, a second semiconductor layer of the pixel driving circuit, a third conductive layer of the pixel driving circuit and a fourth conductive layer of the pixel driving circuit according to an exemplary embodiment of the present disclosure. FIG. 19 is a schematic plane configuration view of a fifth conductive layer of a pixel driving circuit according to an exemplary embodiment of the present disclosure. FIG. 20 is a schematic plane configuration view of a combination of a first semiconductor layer of a pixel driving circuit, a first conductive layer of the pixel driving circuit, a second conductive layer of the pixel driving circuit, a second semiconductor layer of the pixel driving circuit, a third conductive layer of the pixel driving circuit, a fourth conductive layer of the pixel driving circuit and a fifth conductive layer of the pixel driving circuit according to an exemplary embodiment of the present disclosure. FIG. 21 is a plan view schematically showing an overlapping area of a first capacitor and a second capacitor. FIG. 22 is a schematic diagram showing a sectional structure of a display substrate taken along line AA' in FIG. 20 according to some exemplary embodiments of the present disclosure.

With reference to FIG. 7 to FIG. 22, the display substrate includes a base substrate 1 and a plurality of film layers disposed on the base substrate 1. In some embodiments, the plurality of film layers shown include at least a first semiconductor layer 2, a first conductive layer 3, a second conductive layer 4, a second semiconductor layer 5, a third conductive layer 6, a fourth conductive layer 7 and a fifth conductive layer 8. The first semiconductor layer 2, the first conductive layer 3, the second conductive layer 4, the second semiconductor layer 5, the third conductive layer 6, the fourth conductive layer 7 and the fifth conductive layer 8 are sequentially disposed away from the base substrate 1.

For example, the first semiconductor layer 2 may be formed of a semiconductor material such as low-temperature poly-silicon, and a film layer thickness of the first semiconductor layer 2 is in a range of 400 angstroms to 800 angstroms, such as 500 angstroms. The second semiconductor layer 5 may be formed of an oxide semiconductor material, such as a poly-silicon oxide semiconductor material such as IGZO, and a film layer thickness of the second semiconductor layer 5 may be in a range of 300 to 600 angstroms, such as 400 angstroms. The first conductive layer 3, the second conductive layer 4 and the third conductive layer 6 may be formed of a conductive material that forms the gates of the thin film transistors, for example, the conductive material may be Mo, and a film layer thickness of first conductive layer 3, a film layer thickness of the second conductive layer 4 and a film layer thickness of the third conductive layer 6 may be in a range of 2000 angstroms to 3000 angstroms, such as 2500 angstroms. The fourth conductive layer 7 and the fifth conductive layer 8 may be formed of a conductive material that forms the sources and the drains of the thin film transistors, such as Ti and Al. The fourth conductive layer 7 and the fifth conductive layer 8 may have a stack structure formed of Ti/Al/Ti, a film thickness of which is in a range of 7000 to 9000 angstroms. For example, in the case that the fourth conductive layer 7 and the fifth conductive layer 8 have the stack structure formed of Ti/Al/Ti, thicknesses of the respective layers of the Ti/Al/Ti stack structure may be substantially 500 angstroms, 5500 angstroms and 500 angstroms, respectively.

In the embodiments of the present disclosure, the first transistor T1, the second transistor T2, the third transistor T3, the fourth transistor T4, the fifth transistor T5, the sixth transistor T6 and the seventh transistor T7 may be formed along the first semiconductor layer 2 as shown in FIG. 7. The eighth transistor T8 may be formed along the second semiconductor layer 5 as shown in FIG. 12.

As shown in FIG. 7, the first semiconductor layer 2 may have a curved shape or a bent shape, and may include a first active layer 20a corresponding to the first transistor T1, a second active layer 20b corresponding to the second transistor T2, a third active layer 20c corresponding to the third transistor T3, a fourth source layer 20d corresponding to the fourth transistor T4, a fifth active layer 20e corresponding to the fifth transistor T5, a sixth active layer 20f corresponding to the sixth transistor T6, and a seventh active layer 20g corresponding to the seventh transistor T7.

For example, the first semiconductor layer 2 may include poly-silicon, such as a low-temperature poly-silicon material. The active layer of each transistor may include a channel region, a source region and a drain region. The channel region may be a non-doped region, or a doping type of the channel region is different from a doping type of the source region and a doping type of the drain region, and the channel region therefore has semiconductor characteristics. The source region and the drain region are respectively located on both sides of the channel region and doped with impurities, and are thus conductive. Impurities may be varied depending on whether the TFT is an N-type transistor or a P-type transistor.

The first transistor T1 includes the first active layer 20a and a first gate G1. The first active layer 20a includes a first source region 203a, a first drain region 205a, and a first channel region 201a connecting the first source region 203a and the first drain region 205a. The first source region 203a and the first drain region 205a extend in two opposite directions with respect to the first channel region 201a.

The second transistor T2 includes the second active layer 20b and a second gate G2. The second active layer 20b includes a second source region 203b, a second drain region 205b, and a second channel region 201b connecting the second source region 203b and the second drain region 205b. The second source region 203b and the second drain region 205b extend in two opposite directions with respect to the second channel region 201b.

The third transistor T3 includes the third active layer 20c and a third gate G3. The third active layer 20c includes a third source region 203c, a third drain region 205c, and a third channel region 201c connecting the third source region 203c and the third drain region 205c. The third source region 203c and the third drain region 205c extend in two opposite directions with respect to the third channel region 201c.

The fourth transistor T4 includes the fourth source layer 20d and a fourth gate G4. The fourth source layer 20d includes a fourth source region 203d, a fourth drain region 205d, and a fourth channel region 201d connecting the fourth source region 203d and the fourth drain region 205d. The fourth source region 203d and the fourth drain region 205d extend in two opposite directions with respect to the fourth channel region 201d.

The fifth transistor T5 includes the fifth active layer 20e and a fifth gate G5. The fifth active layer 20e includes a fifth source region 203e, a fifth drain region 205e, and a fifth channel region 201e connecting the fifth source region 203e and the fifth drain region 205e. The fifth source region 203e and the fifth drain region 205e extend in two opposite directions with respect to the fifth channel region 201e.

The sixth transistor T6 includes the sixth active layer 20f and a sixth gate G6. The sixth active layer 20f includes a sixth source region 203f, a sixth drain region 205f, and a sixth channel region 201f connecting the sixth source region 203f and the sixth drain region 205f. The sixth source region 203f and the sixth drain region 205f extend in two opposite directions with respect to the sixth channel region 201f.

The seventh transistor T7 includes the seventh active layer 20g and a seventh gate G7. The seventh active layer 20g includes a seventh source region 203g, a seventh drain region 205g, and a seventh channel region 201g connecting the seventh source region 203g and the seventh drain region 205g. The seventh source region 203g and the seventh drain region 205g extend in two opposite directions with respect to the seventh channel region 201g.

With reference to FIG. 7, structures 21 and 22 in the first semiconductor layer 2 are active layers of adjacent sub-pixels. That is to say, FIG. 7 mainly shows an active layer of one sub-pixel.

As shown in FIG. 8 and FIG. 9, the reset control line R1, the scanning line S1, the first light-emitting control line E1, and the light-emitting element reset line R2 are all located in the first conductive layer 3. A first conductive structure CG1 is also located in the first conductive layer 3. An overlap between the first conductive structure CG1 and the first semiconductor layer 2 forms the third gate G3 of the third transistor T3. An overlap between the reset control line R1 and the first semiconductor layer 2 forms the first gate G1 of the first transistor T1. A part of an overlap between the scanning line S1 and the first semiconductor layer 2 forms the second gate G2 of the second transistor T2, and another part of the overlap between the scanning line S1 and the first semiconductor layer 2 forms the fourth gate G4 of the fourth transistor T4. A part of an overlap between the first light-emitting control line E1 and the first semiconductor layer 2 forms the fifth gate G5 of the fifth transistor T5, and another part of the overlap between the first light-emitting control line E1 and the first semiconductor layer 2 forms the sixth gate G6 of the sixth transistor T6. An overlap between the light-emitting element reset line R2 and the first semiconductor layer 2 forms the seventh gate G7 of the seventh transistor T7.

The first conductive structure CG1 also forms an electrode plate of the second capacitor C2, such as the first electrode plate C2a. That is, the first conductive structure CG1 serve as both the gate of the third transistor T3 and one electrode plate of the second capacitor C2.

The first light-emitting control line E1 has a widened portion E1W between the fifth gate G5 and the sixth gate G6. As shown in FIG. 9, in an extension direction of the first light-emitting control line E1, i.e., in a first direction X, the widened portion E1W is between the fifth gate G5 and the sixth gate G6. A size of the widened portion E1W along a second direction Y is greater than a size of other portions of the first light-emitting control line E1 along the second direction Y. The size of the widened portion E1W along the second direction Y is greater than a size of each of the fifth gate G5 and the sixth gate G6 along the second direction Y. The first light-emitting control line E1 extends along the first direction X, and the second direction Y intersects with the first direction X. For example, the second direction Y is perpendicular to the first direction X.

For example, an orthographic projection of the first electrode plate C1a of the first capacitor on the base substrate is between an orthographic projection of the first electrode plate C2a of the second capacitor on the base substrate and an orthographic projection of the light-emitting element reset line R2 on the base substrate in the second direction Y.

As shown in FIG. 9, a spacing PD1 between the first gate G1 and the first electrode plate C1a of the first capacitor in the first direction X is smaller than a spacing PD2 between the seventh gate G7 and the first electrode plate C1a of the first capacitor in the first direction X. It will be noted that the spacing PD1 between the first gate G1 and the first electrode plate C1a of the first capacitor in the first direction X may be represented by a distance between a midline of the first electrode gate G1 in the first direction X and a midline of the first electrode plate C1a of the first capacitor in the first direction X. Similarly, a spacing PD2 between the seventh gate G7 and the first electrode plate C1a of the first capacitor in the first direction X may be represented by a distance between a midline of the seventh gate G7 in the first direction X and the midline of the first electrode plate C1a of the first capacitor in the first direction X.

As shown in FIG. 10, the second light-emitting control line E2 is located in the second conductive layer 4. The second electrode plate C1b of the first capacitor C1 and the second electrode plate C2b of the second capacitor C2 are also located in the second conductive layer 4.

For example, the orthographic projection of the second electrode plate C1b of the first capacitor C1 at least partially overlaps with an orthographic projection of the widened portion E1W of the first light-emitting control line E1 on the base substrate. The overlap between the first light-emitting control line E1 and the second electrode plate C1b of the first capacitor C1 forms the first electrode plate C1a of the first capacitor C1. That is to say, at least a part of the widened portion E1W forms the first electrode plate C1a of the first capacitor C1.

For example, the orthographic projection of the second electrode plate C2b of the second capacitor C2 at least partially overlaps with an orthographic projection of the first conductive structure CG1 on the base substrate. The overlap between the first conductive structure CG1 and the second electrode plate C2b of the second capacitor C2 forms the second electrode plate C2a of the second capacitor C2.

FIG. 21 schematically shows an orthographic projection of the overlap between the first electrode plate C1a and the second electrode plate C1b of the first capacitor C1 on the base substrate, and an orthographic projection of the overlap between the first electrode plate C2a and the second electrode plate C2b of the second capacitor C2 on the base substrate.

In the embodiments of the present disclosure, the orthographic projection of the second electrode plate C1b of the first capacitor on the base substrate substantially covers the orthographic projection of the widened portion E1W on the base substrate, and an area of the orthographic projection of the first electrode plate C2a of the second capacitor on the base substrate is greater than an area of the orthographic projection of the widened portion E1W on the base substrate.

In the embodiments of the present disclosure, the first electrode plate C1a in the first conductive layer 3 and the second electrode plate C1b in the second conductive layer 4 are disposed opposite to each other. It will be understood that there is an insulation layer or a dielectric layer formed between the first conductive layer 3 and the second conductive layer 4. In this way, the first capacitor C1 is formed by the first electrode plate C1a in the first conductive layer 3 and the second electrode plate C1b in the second conductive layer 4. Similarly, the second capacitor C2 is formed by the first electrode plate C2a in the first conductive layer 3 and the second electrode plate C2b in the second conductive layer 4.

As shown in FIG. 21, an area of the orthographic projection of the overlap between the first electrode plate C1a and the second electrode plate C1b of the first capacitor C1 on the base substrate is smaller than an area of the orthographic projection of the overlap between the first electrode plate C2a and the second electrode plate C2b of the second capacitor C2 on the base substrate. In this way, a capacitance value of the first capacitor C1 is smaller than a capacitance value of the second capacitor C2. For example, a ratio of the capacitance value of the second capacitor C2 to the capacitance value of the first capacitor C1 may be within a range of 5 to 20, for example, within a range of 5 to 10, a range of 8 to 10, or a range of 8 to 9. In the embodiments of the present disclosure, by setting the capacitance value of the first capacitor, the first capacitor may maintain a constant potential at the node N2. In this way, even when the frequency of the driving signal changes, flicker and/or ghost may be prevented by controlling the voltage at the first electrode of the driving transistor. In addition, by setting a large capacitance value of the second capacitor C2, it is possible to improve the performance of the display panel and reduce a power consumption of the display panel. In the embodiments of the present disclosure, the ratio of the capacitance value of the second capacitor C2 to the capacitance value of the first capacitor C1 may be within the range of 5 to 20, especially within the range of 8 to 10, which is conducive to the improvement of the stability of the driving transistor, and when the driving frequency changes, the display device may prevent flicker and/or ghost by controlling the voltage at the first electrode of the driving transistor.

With reference to FIG. 10 and FIG. 12, the second electrode plate C2b includes a through hole 4H, which exposes a part of the first conductive structure CG1, so as to electrically connect the third gate G3 of the third transistor T3 to other components.

For example, the through hole 4H exposes at least a part of the first electrode plate C2a of the second capacitor. For example, a ratio of an area of the orthographic projection of the second electrode plate C1b of the first capacitor on the base substrate to an area of an orthographic projection of the through hole 4H on the base substrate is within a range of 1.1 to 5. That is, the area of the orthographic projection of the second electrode plate C1b of the first capacitor on the base substrate is slightly greater than the area of the orthographic projection of the through hole 4H on the base substrate.

As shown in FIG. 9 to FIG. 12, the orthographic projection of the widened portion E1W of the first light-emitting control line E1, which forms the first electrode plate C1a, on the base substrate has a substantially rectangular shape. The orthographic projection of the second electrode plate C1b on the base substrate has a substantially rectangular shape. The "substantially rectangular shape" here includes shapes such as a rectangle, a rectangle with at least one chamfer, and rectangles with at least one rounded corner.

As shown in FIG. 10, a second light-emitting control line 42 is located in the second conductive layer 4.

For example, an orthographic projection of the second light-emitting control line 42 on the base substrate, the orthographic projection of the second electrode plate C2b of the second capacitor on the base substrate, and the orthographic projection of the second electrode plate C1b of the first capacitor on the base substrate are disposed at intervals along the second direction Y. The orthographic projection of the second electrode plate C1b of the first capacitor on the base substrate and the orthographic projection of the second light-emitting control line 42 on the base substrate are respectively located on both sides of the orthographic projection of the second electrode plate C2b of the second capacitor on the base substrate in the second direction.

As shown in FIG. 11, the second semiconductor layer 5 includes the eighth active layer 20h corresponding to the eighth transistor T8. For example, the eighth active layer 20h of the eighth transistor T8 substantially extends along the second direction Y in the figures. The eighth active layer 20h includes an eighth source region 203h, an eighth drain region 205h, and an eighth channel region 201h connecting the eighth source region 203h and the eighth drain region 205h. The eighth source region 203h and the eighth drain region 205h extend in two opposite directions with respect to the eighth channel region 201h.

For example, the second semiconductor layer 5 may include an oxide semiconductor material, such as a low-temperature poly-silicon oxide semiconductor material (abbreviated as LTPO). The active layer of each transistor may include a channel region, a source region and a drain region. The channel region may be a non-doped region, or a doping type of the channel region is different from a doping type of the source region and a doping type of the drain region, and the channel region therefore has semiconductor characteristics. The source region and the drain region are respectively located on both sides of the channel region and doped with impurities, and are thus conductive. Impurities may be varied depending on whether the TFT is an N-type transistor or a P-type transistor.

As shown in FIG. 13, another second light-emitting control line 62 is provided in the third conductive layer 6. For example, each of the two second light-emitting control lines 42 and 62 may transmit the second light-emitting control signal. In some examples, the two second light-emitting control lines 42 and 62 may be electrically connected to each other in a peripheral area of the display substrate, thereby forming the second light-emitting control line E2 as shown.

With reference to FIG. 12, an overlap between the second light-emitting control line 42 and the second conductive layer 4 forms a bottom gate G81 of the eighth transistor T8. An overlap between the other second light-emitting control line 62 and the second conductive layer 4 forms a top gate G82 of the eighth transistor T8. That is, the eighth transistor T8 has a dual gate structure. In the embodiments of the present disclosure, the eighth transistor T8 is implemented as an oxide semiconductor transistor with the dual gate structure, which is conducive to the reduction of the leakage current of the node N1, thereby stabilizing the potential at the node Ni.

With reference to FIG. 13, the first initial voltage line Vi1 is located in the third conductive layer 6. That is, a part of the second light-emitting control line E2 and the first initial voltage line Vi1 are located in the same layer. In the embodiments of the present disclosure, by providing the second light-emitting control line E2 in the third conductive layer 6, a separate light-emitting control signal may be provided for the eighth transistor T8.

With reference to FIG. 17, the display substrate further includes the second initial voltage line Vi2 located in the fourth conductive layer 7 and a plurality of conductive portions. For example, the plurality of conductive portions may include a first conductive portion 71, a second conductive portion 72, a third conductive portion 73, a fourth conductive portion 74, a fifth conductive portion 75, a sixth conductive portion 76 and a seventh conductive portion 77.

With reference to FIG. 19, the display substrate further includes the data line D1, the first voltage line V1, and a first conductive member 81, which are all located in the fifth conductive layer 8.

With reference to FIG. 15 to FIG. 20, a plurality of via holes are schematically shown. One end of the first conductive portion 71 is electrically connected to the source region 203a of the first transistor T1 through a via hole VH2, and the other end of the first conductive portion 71 is electrically connected to the first initial voltage line Vi1 through a via hole VH1. In this way, the source of the first transistor T1 is electrically connected to the first initial voltage line Vi1, and the first initial voltage may be applied to the source of the first transistor T1.

One end of the second conductive portion 72 is electrically connected to the source region 203d of the fourth transistor T4 through a via hole VH3, and the other end of the second conductive portion 72 is electrically connected to the data line D1 through a via hole VH4. In this way, the source of the fourth transistor T4 is electrically connected to the data line D1, and the data signal may be applied to the source of the fourth transistor T4.

One end of the third conductive portion 73 is electrically connected to the source region 203b of the second transistor T2 through a via hole VH5, and the other end of the third conductive portion 73 is electrically connected to the drain region 205h of the eighth transistor T8 through a via hole VH6. In this way, the source of the second transistor T2 may be electrically connected to the drain of the eighth transistor T8.

One end of the fourth conductive portion 74 is electrically connected to the source region 203h of the eighth transistor T8 through a via hole VH7, and the other end of the fourth conductive portion 74 is electrically connected to the third gate G3 through a via hole VH8 and the through hole 4H. In this way, the node N1 shown in FIG. 4 is formed, so as to electrically connect the source of the eighth transistor T8, the third gate G3 and the electrode plate C2a of the second capacitor C2.

For example, an orthographic projection of the via hole VH8 on the base substrate falls within the orthographic projection of the through hole 4H on the base substrate. In this way, the via hole VH8 and the through hole 4H expose a part of the third gate G3 below, so as to electrically connect the third gate G3 and the source of the eighth transistor T8.

One end of the fifth conductive portion 75 is electrically connected to the electrode plate C1b of the first capacitor through a via hole VH10, and the other end of the fifth conductive portion 75 is electrically connected to the drain region 205d of the fourth transistor T4 and the drain region 205c of the third transistor T3 through a via hole VH9. In this way, the node N2 shown in FIG. 4 is formed, so as to electrically connect the drain of the fourth transistor T4, the drain of the third transistor T3 and the electrode plate C1b of the first capacitor C1. A first part of the sixth conductive portion 76 is electrically connected to the drain region 205e of the fifth transistor T5 through a via hole VH11, a second part of the sixth conductive portion 76 is electrically connected to the electrode plate C2b of the second capacitor C2 through a via hole VH12, and a third part of the sixth conductive portion 76 is electrically connected to the first voltage line V1 through a via hole VH13. In this way, the high voltage VDD may be applied to the drain of the fifth transistor T5 and the electrode plate C2b of the second capacitor C2.

With reference to FIG. 17, an orthographic projection of the fifth conductive portion 75 on the base substrate is between an orthographic projection of the fourth conductive portion 74 on the base substrate and an orthographic projection of the sixth conductive portion 76 on the base substrate.

For example, the sixth conductive portion 76 may include a first part and a second part, where an orthographic projection of the first part on the base substrate has a shape of an inverse L, and an orthographic projection of the second part on the base substrate has a shape approximately to a rectangle, hexagon or octagon. The first part of the sixth conductive portion 76 and the second part of the sixth conductive portion 76 are interconnected to form an integral structure.

For example, the orthographic projection of the fifth conductive portion 75 on the base substrate overlaps with an orthographic projection of each of the first electrode plate and the second electrode plate of the second capacitor C2 on the base substrate, In this way, in the light-emitting stage, one of the electrode plates of the second capacitor C2 is connected to a low potential, so as to further pull down the potential at the node N1, which is conducive to the light-emitting and display.

In the embodiments of the present disclosure, the seventh conductive portion 77 is electrically connected to the source region 203f of the sixth transistor T6 and the drain region 205g of the seventh transistor T7 through a via hole VH14, that is, the node N4 in FIG. 4 is led upwards. The seventh conductive portion 77 in the fourth conductive layer 7 and the first conductive member 81 in the fifth conductive layer 8 are electrically connected to each other through a via hole. The anode of the organic light-emitting diode 100 may be electrically connected to the first conductive member 81 through a via hole. In this way, the source of the sixth transistor T6 and the drain of the seventh transistor T7 may be electrically connected to the anode of the organic light-emitting diode 100.

For example, the orthographic projection of the first electrode plate C1a of the first capacitor on the base substrate is between the orthographic projection of the sixth conductive portion 76 on the base substrate and the orthographic projection of the seventh conductive portion 77 on the base substrate in the first direction X. Any two of the orthographic projection of the first electrode plate C1a of the first capacitor on the base substrate, the orthographic projection of the sixth conductive portion 76 on the base substrate and the orthographic projection of the seventh conductive portion 77 on the base substrate are spaced apart from each other. The orthographic projection of the second electrode plate C1b of the first capacitor on the base substrate partially overlaps with the orthographic projection of the seventh conductive portion 77 on the base substrate.

For example, the orthographic projection of the first voltage line V1 on the base substrate covers the orthographic projection of the fourth conductive portion 74 on the base substrate; and/or, the orthographic projection of the first voltage line V1 on the base substrate covers the orthographic projection of the active layer of the eighth transistor T8 on the base substrate.

Other film layers (such as insulation layers) of the display substrate according to the embodiments of the present disclosure will be described below in combination with plan views (such as FIG. 7 to FIG. 20) and a sectional view (FIG. 22).

In an exemplary embodiment, the display substrate may include the first semiconductor layer 2 disposed on the base substrate 1, and a first gate insulation layer 107 disposed on a side of the first semiconductor layer 2 away from the base substrate 1. For example, the first gate insulation layer 107 may be formed of silicon oxide with a thickness of approximately 1000 to 2000 angstroms.

The display substrate may include the first conductive layer 3 disposed on a side of the first gate insulation layer 107 away from the base substrate 1, and a first interlayer dielectric layer 108 disposed on a side of the first conductive layer 3 away from the base substrate 1. For example, the first interlayer insulation layer 108 may be formed of silicon nitride with a thickness of approximately 1000 to 2000 angstroms.

The display substrate may include the second conductive layer 4 disposed on a side of the first interlayer dielectric layer 108 away from the base substrate 1, and a second interlayer dielectric layer 109 disposed on a side of the second conductive layer 4 away from the base substrate 1. For example, the second interlayer dielectric layer 109 may be formed of an insulation material such as silicon nitride.

The display substrate may include a buffer layer 110 disposed on a side of the second interlayer dielectric layer 109 away from the base substrate 1, the second semiconductor layer 5 disposed on a side of the buffer layer 110 away from the base substrate 1, and a second gate insulation layer 116 disposed on a side of the second semiconductor layer 5 away from the base substrate 1.

The display substrate may include the third conductive layer 6 disposed on a side of the second gate insulation layer 116 away from the base substrate 1, a third interlayer dielectric layer 111 disposed on a side of the third conductive layer 6 away from the base substrate 1, the fourth conductive layer 7 disposed on a side of the third interlayer dielectric layer 111 away from the base substrate 1, a first planarization layer 112 disposed on a side of the fourth conductive layer 7 away from the base substrate 1, the fifth conductive layer 8 disposed on a side of the first planarization layer 112 away from the base substrate 1, a second planarization layer 113 disposed on a side of the fifth conductive layer 8 away from the base substrate 1, an anode layer 208 disposed on a side of the second planarization layer 113 away from the base substrate 1, and a pixel definition layer 114 disposed on a side of the anode layer 208 away from the base substrate 1.

For example, the planarization layers may be formed of polyimide (PI).

At least some embodiments of the present disclosure further provide a display panel, which includes the display substrate as described above. For example, the display panel may be an OLED display panel.

With reference to FIG. 1, at least some embodiments of the present disclosure further provide a display device, which may include the display substrate as described above.

The display device may include any device or product with a display function. For example, the display device may be a smart phone, a mobile phone, an e-book reader, a desktop computer (PC), a laptop PC, a netbook PC, a personal digital assistant (PDA), a portable multimedia player (PMP), a digital audio player, a mobile medical device, a camera, a wearable device (such as a headset, an electronic dress, an electronic bracelet, an electronic necklace, an electronic accessory, an electronic tattoo, and a smart watch), a television, etc.

It will be understood that according to the embodiments of the present disclosure, the display panel and the display device have all the characteristics and advantages of the display substrate mentioned above, and for details, reference may be made to the above description, which will not be repeated here.

Although some embodiments of the general technical concept of the present disclosure have been shown and described, those of ordinary skill in the art will understand that changes may be made to these embodiments without departing from the principle and spirit of the general technical concept. The scope of the present disclosure is defined by the claims and their equivalents.

What is claimed is:

1. A display substrate, comprising:
a base substrate;
a first semiconductor layer disposed on the base substrate;
a first conductive layer disposed on a side of the first semiconductor layer away from the base substrate; and
a second conductive layer disposed on a side of the first conductive layer away from the base substrate,
wherein the display substrate further comprises a pixel driving circuit disposed on the base substrate, the pixel driving circuit comprises a driving circuit, a storage circuit and a reset circuit, wherein the reset circuit is electrically connected to a first terminal of the driving circuit or a second terminal of the driving circuit, and is configured to initialize a potential at the first terminal of the driving circuit or a potential at the second terminal of the driving circuit in an initialization stage; the driving circuit is configured to conduct a path between the first terminal of the driving circuit and the second terminal of the driving circuit under control of a potential at a control terminal of the driving circuit; and the storage circuit is electrically connected to the control terminal of the driving circuit and is configured to store electrical energy; and
wherein the reset circuit comprises a first capacitor, the storage circuit comprises a second capacitor, the first capacitor comprises a first electrode plate and a second electrode plate disposed opposite to the first electrode plate, the second capacitor comprises a first electrode plate and a second electrode plate disposed opposite to the first electrode plate, the first electrode plate of the first capacitor and the first electrode plate of the second capacitor are located in the first conductive layer, and the second electrode plate of the first capacitor and the second electrode plate of the second capacitor are located in the second conductive layer; an orthographic projection of the first electrode plate of the first capacitor on the base substrate and an orthographic projection of the first electrode plate of the second capacitor are spaced from each other on the base substrate, an orthographic projection of the second electrode plate of the first capacitor on the base substrate and an orthographic projection of the second electrode plate of the second capacitor are spaced from each other on the base substrate, the orthographic projection of the first electrode plate of the first capacitor on the base substrate at least partially overlaps with the orthographic projection of the second electrode plate of the first capacitor on the base substrate, and the orthographic projection of the first electrode plate of the second capacitor on the base substrate at least partially overlaps with the orthographic projection of the second electrode plate of the second capacitor on the base substrate, wherein an area of the overlap between the orthographic projection of the first electrode plate of the first capacitor on the base substrate and the orthographic projection of the second electrode plate of the first capacitor on the base substrate is smaller than an area of the overlap between the orthographic projection of the first electrode plate of the second capacitor on the base substrate and the orthographic projection of the second electrode plate of the second capacitor on the base substrate, and a ratio of the area of the overlap between the orthographic projection of the first electrode plate of the second capacitor on the base substrate and the orthographic projection of the second electrode plate of the second capacitor on the base substrate to the area of the overlap between the orthographic projection of the first electrode plate of the first capacitor on the base substrate and the orthographic projection of the second electrode plate of the first capacitor on the base substrate is within a range of 5 to 20.

2. The display substrate of claim 1, further comprising a first light-emitting control line, disposed on the base substrate and configured to supply a first light-emitting control signal to the pixel driving circuit,
wherein the first light-emitting control line is located in the first conductive layer, and a part of the first light-emitting control line overlapping with the second electrode plate of the first capacitor forms the first electrode plate of the first capacitor.

3. The display substrate of claim 2, wherein the pixel driving circuit comprises a first light-emitting control circuit and a second light-emitting control circuit, the first light-emitting control circuit comprises a first transistor, the second light-emitting control circuit comprises a second transistor, the first transistor comprises a first gate, the second transistor comprises a second gate, and the first light-emitting control line applies the first light-emitting control signal to the first gate, the second gate, and the first electrode plate of the first capacitor.

4. The display substrate of claim 3, wherein a part of the first light-emitting control line overlapping with the first semiconductor layer forms the first gate, and another part of the first light-emitting control line overlapping with the first semiconductor layer forms the second gate; and the first light-emitting control line further comprises a widened portion, the widened portion is located between the first gate and the second gate in a first direction, and a size of the widened portion in a second direction is greater than a size of each of the first gate and the second gate in the second direction, wherein the first light-emitting control line extends in the first direction, and the second direction intersects with the first direction; and
at least a part of the widened portion forms the first electrode plate of the first capacitor.

5. The display substrate of claim 4, wherein the orthographic projection of the second electrode plate of the first capacitor on the base substrate covers an orthographic projection of the widened portion on the base substrate; and/or
an area of the orthographic projection of the first electrode plate of the second capacitor on the base substrate is greater than an area of the orthographic projection of the widened portion on the base substrate; and/or,
an area of the orthographic projection of the second electrode plate of the second capacitor on the base substrate is greater than an area of the orthographic projection of the second electrode plate of the first capacitor on the base substrate.

6. The display substrate of claim 1, wherein the ratio of the area of the overlap between the orthographic projection of the first electrode plate of the second capacitor on the base substrate and the orthographic projection of the second electrode plate of the second capacitor on the base substrate to the area of the overlap between the orthographic projection of the first electrode plate of the first capacitor on the base substrate and the orthographic projection of the second electrode plate of the first capacitor on the base substrate is within a range of 8 to 10.

7. The display substrate of claim 6, wherein the second electrode plate of the second capacitor comprises a through hole exposing at least a part of the first electrode plate of the second capacitor, and a ratio of an area of the orthographic projection of the second electrode plate of the first capacitor on the base substrate to an area of an orthographic projection of the through hole on the base substrate is within a range of 1.1 to 5.

8. The display substrate of claim 1, further comprising a light-emitting element reset line located in the first conductive layer and a light-emitting element disposed on the base substrate, wherein the pixel driving circuit comprises a first initialization circuit configured to initialize a first electrode of the light-emitting element under control of a signal provided by the light-emitting element reset line.

9. The display substrate of claim 8, further comprising a reset control line located in the first conductive layer, wherein the pixel driving circuit comprises a second initialization circuit configured to initialize the driving circuit under control of a reset control signal provided by the reset control line; and
a frequency of the signal provided by the light-emitting element reset line is higher than a frequency of the reset control signal provided by the reset control line.

10. The display substrate of claim 1, further comprising a light-emitting element reset line located in the first conductive layer and a light-emitting element disposed on the base substrate, wherein the pixel driving circuit comprises a first initialization circuit, the first initialization circuit comprises a third transistor, and a part of the light-emitting element reset line overlapping with the first semiconductor layer forms a third gate of the third transistor; and
the orthographic projection of the first electrode plate of the first capacitor on the base substrate is between the orthographic projection of the first electrode plate of the second capacitor on the base substrate and an orthographic projection of the light-emitting element reset line on the base substrate in a second direction.

11. The display substrate of claim 10, wherein the pixel driving circuit comprises a fourth transistor, and a part of a reset control line overlapping with the first semiconductor layer forms a fourth gate of the fourth transistor; and
a spacing between the fourth gate and the first electrode plate of the first capacitor in a first direction is smaller than a spacing between the third gate and the first electrode plate of the first capacitor in the first direction.

12. The display substrate of claim 1, wherein the display substrate further comprises a second light-emitting control line located in the second conductive layer, wherein an orthographic projection of the second light-emitting control line on the base substrate, the orthographic projection of the second electrode plate of the second capacitor on the base substrate and the orthographic projection of the second electrode plate of the first capacitor on the base substrate are disposed at intervals along a second direction; and
the orthographic projection of the second electrode plate of the first capacitor on the base substrate and the orthographic projection of the second light-emitting control line on the base substrate are respectively located on both sides of the orthographic projection of the second electrode plate of the second capacitor on the base substrate in the second direction.

13. The display substrate of claim 12, further comprising:
a second semiconductor layer disposed on a side of the second conductive layer away from the base substrate; and
a third conductive layer disposed on a side of the second semiconductor layer away from the base substrate, wherein the second semiconductor layer comprises an oxide semiconductor material;
the display substrate comprises a further second light-emitting control line located in the third conductive layer, wherein the second light-emitting control line is electrically connected to the further second light-emitting control line; and the pixel driving circuit comprises an on-off control circuit, wherein the on-off control circuit comprises a fifth transistor, a part of the second light-emitting control line overlapping with the second semiconductor layer forms a bottom gate of the fifth transistor, and a part of the further second light-emitting control line overlapping with the second semiconductor layer forms a top gate of the fifth transistor.

14. The display substrate of claim 13, further comprising: a fourth conductive layer disposed on a side of the third conductive layer away from the base substrate, wherein the driving circuit comprises a sixth transistor; and the display substrate comprises a first conductive portion located in the fourth conductive layer, wherein one end of the first conductive portion is electrically connected to the second electrode plate of the first capacitor through a first via hole, and another end of the first conductive portion is electrically connected to a first electrode of the sixth transistor through a second via hole.

15. The display substrate of claim 14, wherein the pixel driving circuit comprises a first light-emitting control circuit and a second light-emitting control circuit, the first light-emitting control circuit comprises a first transistor, the second light-emitting control circuit comprises a second transistor; and wherein the display substrate further comprises a second conductive portion located in the fourth conductive layer, wherein the second conductive portion comprises a first part, a second part and a third part; and wherein the first part of the second conductive portion is electrically connected to a first electrode of the first transistor through a third via hole, and the second part of the second conductive portion is electrically connected to the second electrode plate of the second capacitor through a fourth via hole.

16. The display substrate of claim 15, further comprising a fifth conductive layer disposed on a side of the fourth conductive layer away from the base substrate, wherein the display substrate further comprises a first voltage line disposed in the fifth conductive layer; and the third part of the second conductive portion is electrically connected to the first voltage line through a fifth via hole.

17. The display substrate of claim 14, wherein the pixel driving circuit comprises a first light-emitting control circuit and a second light-emitting control circuit, the first light-emitting control circuit comprises a first transistor, the second light-emitting control circuit comprises a second transistor; and wherein the display substrate further comprises a third conductive portion located in the fourth conductive layer, wherein the third conductive portion is electrically connected to a first electrode of the second transistor; and the orthographic projection of the first electrode plate of the first capacitor on the base substrate is between an orthographic projection of the second conductive portion on the base substrate and an orthographic projection of the third conductive portion on the base substrate in a first direction, and any two of the orthographic projection of the first electrode plate of the first capacitor on the base substrate, the orthographic projection of the second conductive portion on the base substrate and the orthographic projection of the third conductive portion on the base substrate are spaced apart from each other;

wherein the orthographic projection of the second electrode plate of the first capacitor on the base substrate partially overlaps with the orthographic projection of the third conductive portion on the base substrate.

18. The display substrate of claim 14, further comprising a fourth conductive portion located in the fourth conductive layer, one end of the fourth conductive portion is electrically connected to a first electrode of the fifth transistor through a sixth via hole, and another end of the fourth conductive portion is electrically connected to a sixth gate of the sixth transistor through a seventh via hole and a through hole;

wherein an orthographic projection of a first voltage line on the base substrate covers an orthographic projection of the fourth conductive portion on the base substrate; and/or, the orthographic projection of the first voltage line on the base substrate covers an orthographic projection of an active layer of the fifth transistor on the base substrate.

19. A display panel, comprising the display substrate of claim 1.

20. A display device, comprising the display panel of claim 19.

* * * * *

UNITED STATES PATENT AND TRADEMARK OFFICE
CERTIFICATE OF CORRECTION

| | | |
|---|---|---|
| PATENT NO. | : 12,223,908 B2 | Page 1 of 1 |
| APPLICATION NO. | : 18/262598 | |
| DATED | : February 11, 2025 | |
| INVENTOR(S) | : Zhenzhen Shan et al. | |

It is certified that error appears in the above-identified patent and that said Letters Patent is hereby corrected as shown below:

On the Title Page

Add the Foreign Application Priority Data section at item (30) --Sep. 30, 2021 (CN) 202111168519--

Signed and Sealed this
Eighth Day of April, 2025

Coke Morgan Stewart
*Acting Director of the United States Patent and Trademark Office*